(12) United States Patent
Fukuoka et al.

(10) Patent No.: US 10,911,042 B2
(45) Date of Patent: Feb. 2, 2021

(54) SEMICONDUCTOR DEVICE, SEMICONDUCTOR SYSTEM, AND SEMICONDUCTOR DEVICE MANUFACTURING METHOD

(71) Applicant: RENESAS ELECTRONICS CORPORATION, Tokyo (JP)

(72) Inventors: Kazuki Fukuoka, Tokyo (JP); Toshifumi Uemura, Tokyo (JP); Yuko Kitaji, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 272 days.

(21) Appl. No.: 16/045,016

(22) Filed: Jul. 25, 2018

(65) Prior Publication Data
US 2019/0074829 A1 Mar. 7, 2019

(30) Foreign Application Priority Data
Sep. 1, 2017 (JP) ................. 2017-168124

(51) Int. Cl.
*H03K 17/22* (2006.01)
*G06F 1/28* (2006.01)
*G05F 3/24* (2006.01)

(52) U.S. Cl.
CPC ........... *H03K 17/223* (2013.01); *G05F 3/247* (2013.01); *G06F 1/28* (2013.01)

(58) Field of Classification Search
CPC ........ H03K 19/0016; H03K 19/00384; H03K 5/133; H03K 17/223; H03K 3/0315; G11C 5/147; G06F 1/324; G01R 19/16552
See application file for complete search history.

(56) References Cited

U.S. PATENT DOCUMENTS 5,485,111 A 1/1996 Tanimoto
2006/0102980 A1 5/2006 Nakashiba
(Continued)

FOREIGN PATENT DOCUMENTS

JP 06-296125 A 10/1994
JP 08-274607 A 10/1996

OTHER PUBLICATIONS

Extended European Search Report issued in corresponding European Patent Application No. 18189906.3-1216, dated Jan. 21, 2019.

*Primary Examiner* — Bryan R Perez
(74) *Attorney, Agent, or Firm* — McDermott Will & Emery LLP

(57) ABSTRACT

There is a need to provide a semiconductor device, a semiconductor system, and a semiconductor device manufacturing method capable of accurately monitoring a minimum operating voltage for a monitoring-targeted circuit. A monitor portion of a semiconductor system according to one embodiment includes a voltage monitor and a delay monitor. The voltage monitor is driven by power-supply voltage SVCC different from power-supply voltage VDD supplied to an internal circuit as a monitoring-targeted circuit and monitors power-supply voltage VDD. The delay monitor is driven by power-supply voltage VDD and monitors signal propagation time for a critical path in the internal circuit. The delay monitor is configured so that a largest on-resistance of on-resistances for a plurality of transistors configuring the delay monitor is smaller than a largest on-resistance of on-resistances for a plurality of transistors configuring the internal circuit.

18 Claims, 30 Drawing Sheets

(56) References Cited

U.S. PATENT DOCUMENTS

| | | | |
|---|---|---|---|
| 2006/0208759 A1* | 9/2006 | Nojiri | H03K 3/356113 326/81 |
| 2008/0189461 A1 | 8/2008 | Kim | |
| 2010/0327961 A1* | 12/2010 | Ikenaga | H03K 19/0016 327/540 |
| 2011/0233717 A1 | 9/2011 | Jensen et al. | |
| 2014/0070879 A1 | 3/2014 | Kawasaki | |

* cited by examiner

FIG. 9
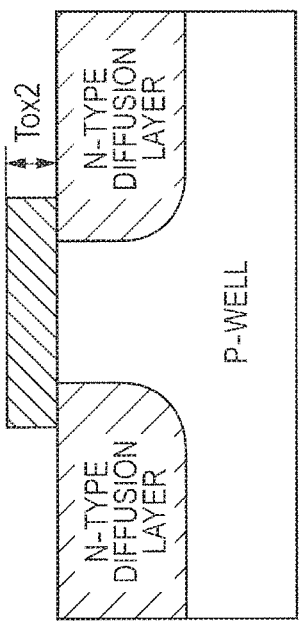
TRANSISTOR FOR DELAY MONITOR
OXIDE FILM THICKNESS Tox2
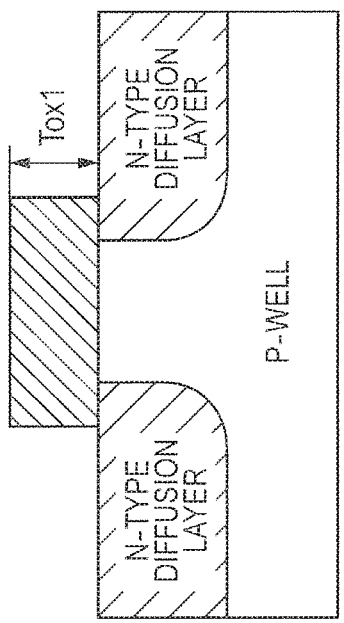
TRANSISTOR FOR INTERNAL CIRCUIT
OXIDE FILM THICKNESS Tox1
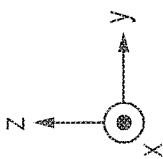

FIG. 20
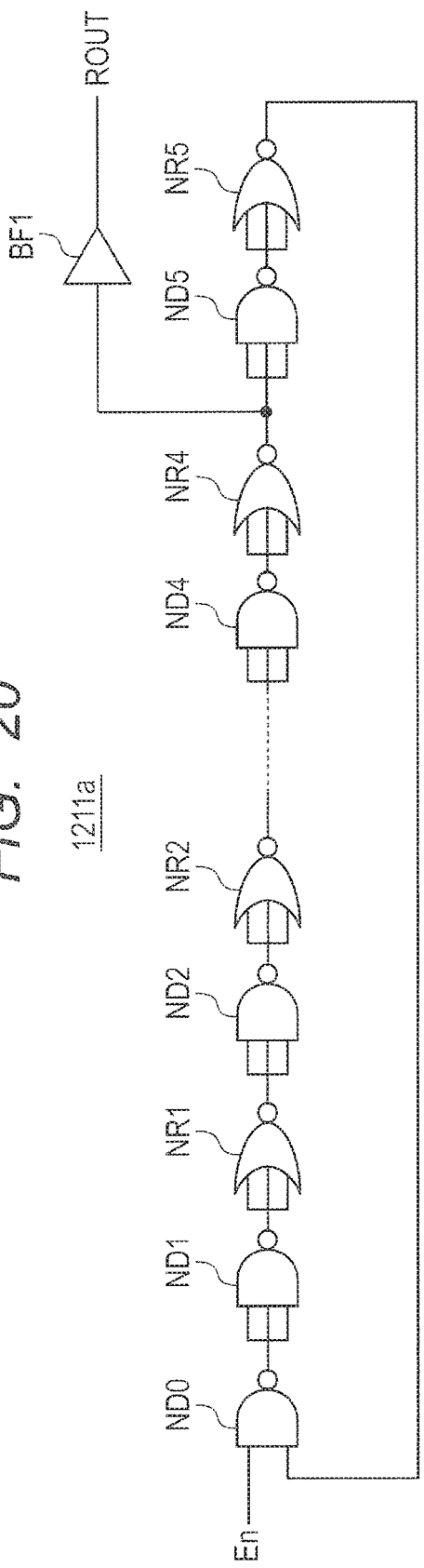
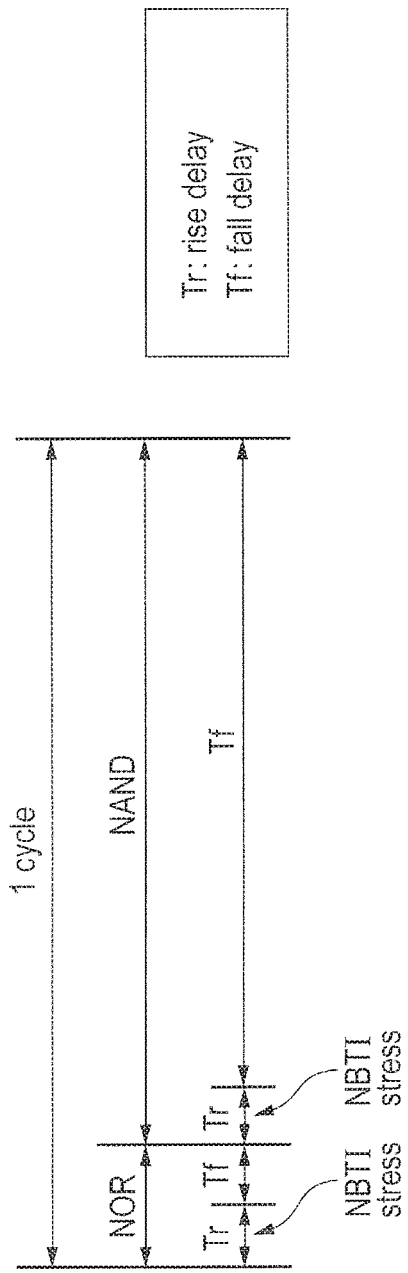

FIG. 31
SYS50
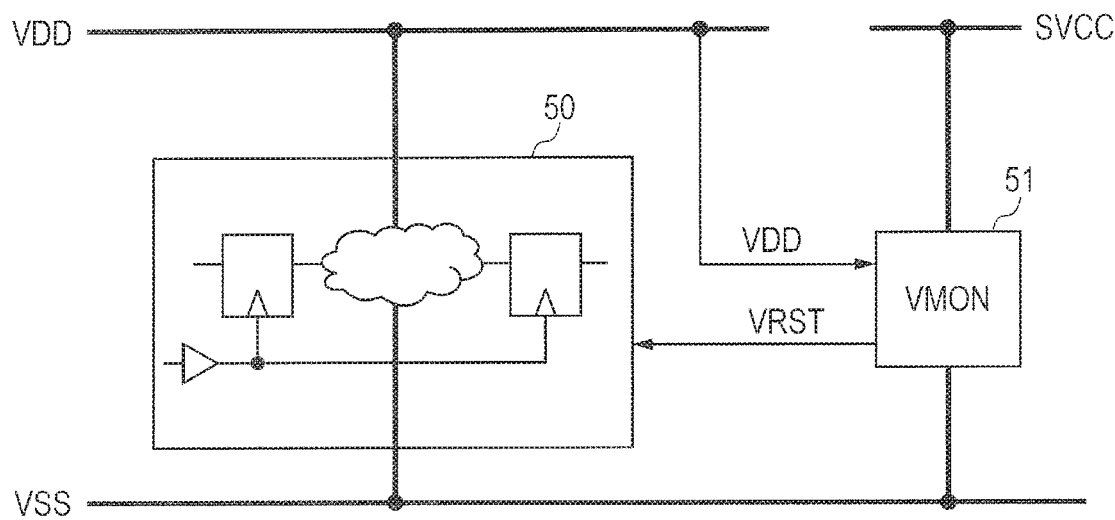
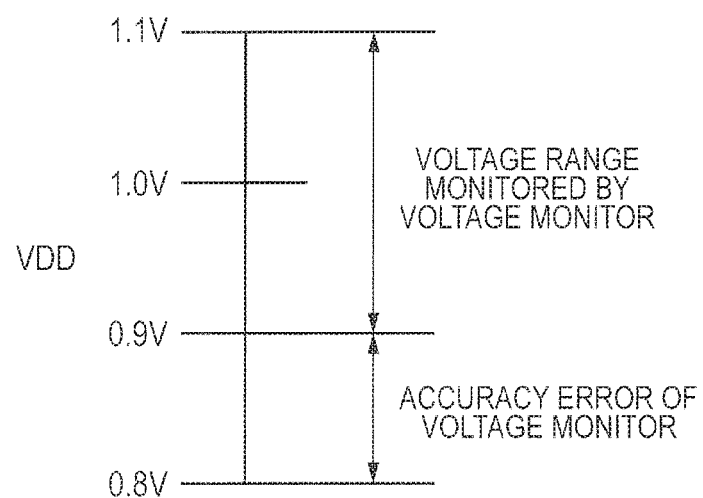

SEMICONDUCTOR DEVICE, SEMICONDUCTOR SYSTEM, AND SEMICONDUCTOR DEVICE MANUFACTURING METHOD

CROSS-REFERENCE TO RELATED APPLICATIONS

The disclosure of Japanese Patent Application No. 2017-168124 filed on Sep. 1, 2017 including the specification, drawings and abstract is incorporated herein by reference in its entirety.

BACKGROUND

The present invention relates to a semiconductor device, a semiconductor system, and a semiconductor device manufacturing method and more particularly to a semiconductor device, a semiconductor system, and a semiconductor device manufacturing method suited to accurately monitor a minimum operating voltage for a monitoring-targeted circuit.

Recently, a semiconductor system includes a monitoring circuit to monitor whether a power-supply voltage is lower than a minimum operating voltage for an internal circuit in order to ensure operation of the internal circuit driven by the power-supply voltage.

For example, patent literature 1 discloses a configuration that highly accurately detects a power-supply voltage without malfunction despite a low voltage by combining a power-supply voltage detection circuit widely varying but consuming a low minimum operating voltage with a power-supply voltage detection circuit providing high accuracy but consuming a high minimum operating voltage.

Further, patent literature 2 discloses a configuration that monitors a power-supply voltage by measuring the propagation delay time using a ring oscillator.

Patent Literature 1: Japanese Unexamined Patent Application Publication No. Hei 6 (1994)-296125

Patent Literature 2: Japanese Unexamined Patent Application Publication No. Hei 8 (1996)-274607

SUMMARY

It is known that the power-supply voltage detection circuit gradually decreases the accuracy of detecting a power-supply voltage due to effects such as aging degradation. The configuration according to patent literature 1 simply uses two types of the power-supply voltage detection circuits and therefore decreases the accuracy of detecting the power-supply voltage due to an effect of the aging degradation. These and other objects and novel features may be readily ascertained by referring to the following description of the present specification and appended drawings.

According to an embodiment, a semiconductor device includes: a voltage monitor that is driven by a second power-supply voltage different from a first power-supply voltage supplied to a monitoring-targeted circuit and monitors the first power-supply voltage; and a delay monitor that is driven by the first power-supply voltage and monitors signal propagation time for a critical path in the monitoring-targeted circuit. The delay monitor is configured so that a largest on-resistance of on-resistances for a plurality of transistors configuring the delay monitor is smaller than a largest on-resistance of on-resistances for a plurality of transistors configuring the monitoring-targeted circuit.

According to another embodiment, a semiconductor device manufacturing method includes the steps of: forming a voltage monitor that is driven by a second power-supply voltage different from a first power-supply voltage supplied to a monitoring-targeted circuit and monitors the first power-supply voltage; and forming a delay monitor that is driven by the first power-supply voltage and monitors signal propagation time for a critical path in the monitoring-targeted circuit. The step of forming the delay monitor allows a largest on-resistance of on-resistances for a plurality of transistors configuring the delay monitor to be smaller than a largest on-resistance of on-resistances for a plurality of transistors configuring the monitoring-targeted circuit.

The above-mentioned embodiment can provide a semiconductor device, a semiconductor system, and a semiconductor device manufacturing method capable of accurately monitoring a minimum operating voltage for a monitoring-targeted circuit.

BRIEF DESCRIPTION OF THE DRAWINGS

FIG. 9 is a schematic sectional view illustrating a fourth configuration example of a transistor configuring the internal circuit and a transistor configuring the delay monitor;

FIG. 20 is a diagram illustrating a specific configuration example of the ring oscillator provided for the oscillator illustrated in FIG. 17;

FIG. 31 is a diagram illustrating an outline of a semiconductor system conceived before the embodiment.

DETAILED DESCRIPTION

Figure 1:
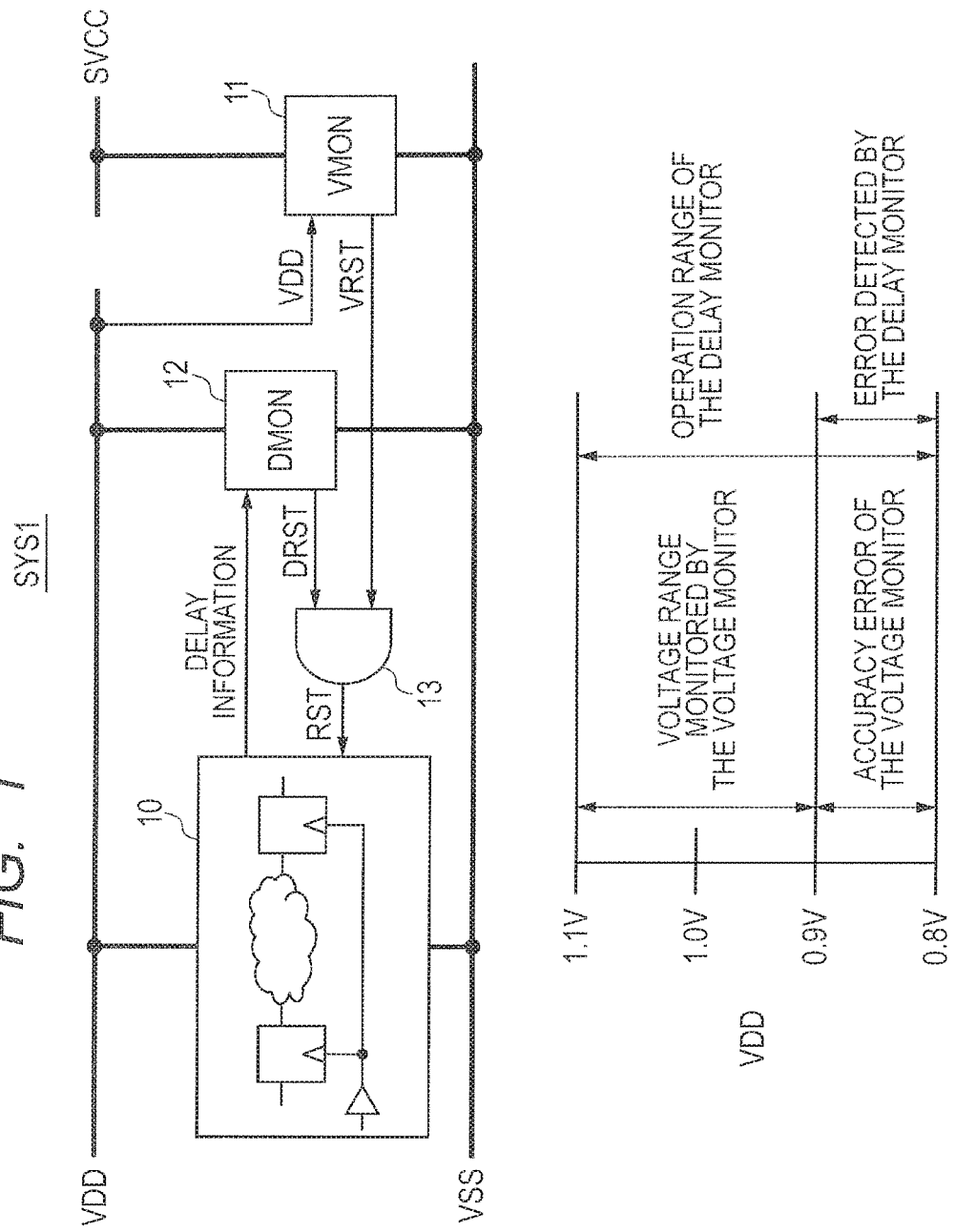
FIG. 1 is a diagram illustrating an outline of a semiconductor system according to a first embodiment.

The description and drawings are omitted and simplified as needed in order to clarify the explanation. Each element illustrated in the drawings as a function block to perform various processes can be configured as hardware including a CPU, memory, and other circuits and can be embodied as software including a program loaded into the memory. It is therefore understood by those skilled in the art that the function blocks can be embodied as hardware only, as software only, or as combinations of these and are not limited to any thereof. In the drawings, mutually corresponding elements are designated by the same reference symbols and a duplicate explanation is omitted as needed.

The above-mentioned program is stored by using various types of non-transitory computer readable medium and can be supplied to computers. The non-transitory computer readable medium includes various types of tangible storage medium. Examples of the non-transitory computer readable medium include magnetic recording media (such as flexible disks, magnetic tape, and hard disks), optical magnetic recording media (such as optical magnetic disks), CD-ROM (Read Only Memory), CD-R, CD-R/W, and semiconductor memory (such as mask ROM, PROM (Programmable ROM), EPROM (Erasable PROM), flash ROM, and RAM (Random Access Memory)). The program may be supplied to computers through various types of transitory computer readable medium. Examples of the transitory computer readable medium include electric signals, optical signals, and electromagnetic waves. The transitory computer readable medium can supply the program to computers via wired communication paths such as electric wires and optical fibers or wireless communication paths.

<Preliminary Study Conducted by the Inventors>

Before proceeding to a detailed description of the semiconductor system according to the first embodiment, the description below explains a semiconductor system SYS50 studied by the inventors in advance.

FIG. 31 is a diagram illustrating an outline of a semiconductor system SYS50 conceived before the embodiment. As illustrated in FIG. 31, the semiconductor system SYS50 includes an internal circuit 50 and a voltage monitor 51.

The internal circuit 50 is driven by power-supply voltage VDD and includes a CPU and its peripheral circuits, for example. The internal circuit 50 is provided as a monitoring-targeted circuit monitored by the voltage monitor 51.

The voltage monitor 51 is driven by power-supply voltage SVCC different from power-supply voltage VDD and monitors whether power-supply voltage VDD falls within a voltage range (operation guarantee voltage range) that ensures operation of the internal circuit 50.

The description below explains an example of the operation guarantee voltage range from 0.9 V to 1.1 V for the internal circuit 50. The voltage monitor 51 therefore monitors whether power-supply voltage VDD falls within the voltage range from 0.9 V to 1.1 V.

For example, suppose power-supply voltage VDD decreases to the minimum operation guarantee voltage of 0.9 V for the internal circuit 50. The voltage monitor 51 then activates reset signal VRST and initializes the internal circuit 50 before the internal circuit 50 operates erratically.

It is known that the voltage monitor 51 gradually decreases the accuracy of detecting power-supply voltage VDD due to an effect such as aging degradation. If the voltage monitor 51 has an accuracy error of 0.1 V, for example, the voltage monitor 51 is unlikely to initialize the internal circuit 50 until power-supply voltage VDD decreases to 0.8 V.

The internal circuit 50 therefore needs to be designed to operate even when power-supply voltage VDD indicates 0.8 V. In other words, the internal circuit 50 needs to be designed to ensure a large voltage margin. In such a case, the internal circuit 50 cannot improve operating frequencies due to stringent design constraints.

To solve this, there is proposed a semiconductor system SYS1 according to the first embodiment having a monitor function capable of accurately monitoring the minimum operating voltage for a monitoring-targeted circuit. It is therefore possible to design the monitoring-targeted circuit based on a small voltage margin and subsequently improve operating frequencies of the monitoring-targeted circuit.

First Embodiment

FIG. 1 is a diagram illustrating an outline of the semiconductor system SYS1 according to the first embodiment. As illustrated in FIG. 1, the semiconductor system SYS1 includes an internal circuit 10, a voltage monitor 11, a delay monitor 12, and an AND circuit 13.

The internal circuit 10 is driven by power-supply voltage VDD and includes a CPU and its peripheral circuits, for example. The internal circuit 10 is provided as a monitoring-targeted circuit monitored by the voltage monitor 11 and the delay monitor 12.

The voltage monitor 11 is driven by power-supply voltage SVCC different from power-supply voltage VDD and monitors whether power-supply voltage VDD falls within a voltage range (operation guarantee voltage range) that ensures operation of the internal circuit 10.

The present embodiment explains an example of the operation guarantee voltage range from 0.9 V to 1.1 V for the internal circuit 10. The voltage monitor 11 therefore monitors whether power-supply voltage VDD falls within the voltage range from 0.9 V to 1.1 V.

For example, suppose power-supply voltage VDD decreases to the minimum operation guarantee voltage of 0.9 V for the internal circuit 10. The voltage monitor 11 then activates reset signal VRST before the internal circuit 10 operates erratically.

The delay monitor 12 is driven by power-supply voltage VDD along with the internal circuit 10 and monitors whether the signal propagation time for a critical path in the internal circuit 10 falls within a predetermined time. The predetermined time conforms to the maximum propagation time allowable as the signal propagation time for a critical path in the internal circuit 10, for example.

For example, suppose the signal propagation time for the critical path is longer than or equal to the predetermined time due to a decrease in power-supply voltage VDD. The delay monitor 12 then activates reset signal DRST before the internal circuit 10 operates erratically.

It is known that the voltage monitor 11 gradually decreases the accuracy of detecting power-supply voltage VDD due to an effect such as aging degradation. If the voltage monitor 11 has an accuracy error of 0.1 V, for example, the voltage monitor 11 is unlikely to initialize the internal circuit 10 until power-supply voltage VDD decreases to 0.8 V.

Taking into consideration a precision error of the voltage monitor 11, the delay monitor 12 is therefore configured to operate even when power-supply voltage VDD is lower than or equal to the minimum operation guarantee voltage of 0.9 V for the internal circuit 10. In other words, the delay monitor 12 is configured to operate even when the voltage monitor 11 having the accuracy error determines that power-supply voltage VDD reaches the minimum operation guarantee voltage of 0.9 V. According to the present embodiment, the delay monitor 12 is configured to operate even when power-supply voltage VDD indicates 0.8 V.

In the semiconductor system SYS1, the voltage monitor 11 monitors whether power-supply voltage VDD is lower than or equal to the minimum operation guarantee voltage of 0.9 V. In addition, the delay monitor 12 monitors whether the signal propagation time for the critical path in the internal circuit 10 falls within an allowable range also in the voltage range of 0.8 V to 0.9 V as an accuracy error range for the voltage monitor 11. Namely, the delay monitor 12 can accurately monitor whether power-supply voltage VDD reaches the actual minimum operating voltage for the internal circuit 10 even when the voltage monitor 11 has an accuracy error.

The internal circuit 10 can be therefore designed based on a small voltage margin without regard for the accuracy error of the voltage monitor 11. According to the present embodiment, the internal circuit 10 may be designed to at least operate when power-supply voltage VDD is higher than or equal to 0.9 V. As a result, the internal circuit 10 can improve operating frequencies owing to alleviated design constraints.

(Details of the Semiconductor System SYS1)

The description below explains in detail the semiconductor system SYS1 with reference to FIGS. 2 through 4.

Figure 2:
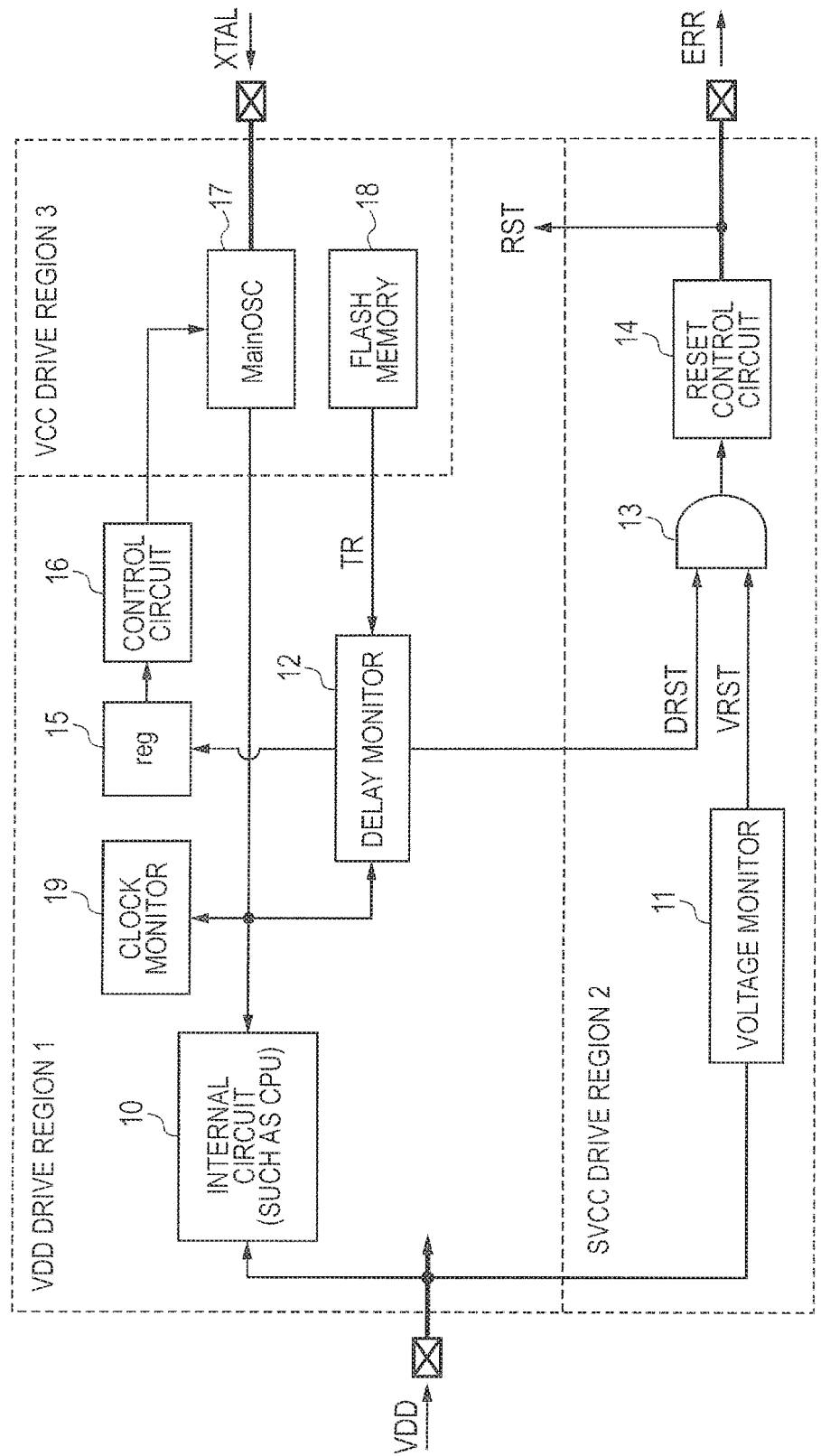
FIG. 2 is a block diagram illustrating a configuration example of the semiconductor system according to the first embodiment.

FIG. 2 is a block diagram illustrating a configuration example of the semiconductor system SYS1.

As illustrated in FIG. 2, the semiconductor system SYS1 includes a VDD drive region 1 driven by power-supply voltage VDD, an SVCC drive region 2 driven by power-supply voltage SVCC, and a VCC drive region 3 driven by power-supply voltage VCC. Power-supply voltages VDD, SVCC, and VCC are supplied from different power supplies.

The present embodiment describes an example of providing the semiconductor system SYS1 over one chip but is not limited thereto. The semiconductor system SYS1 may be divided and provided over a plurality of chips.

The VDD drive region 1 includes an internal circuit 10, a delay monitor 12, a frequency information storage register 15, a control circuit 16, and a clock monitor 19. The SVCC drive region 2 includes a voltage monitor 11, an AND circuit 13, and a reset control circuit 14. The VCC drive region 3 includes a main oscillator 17 and flash memory 18.

Figure 3:
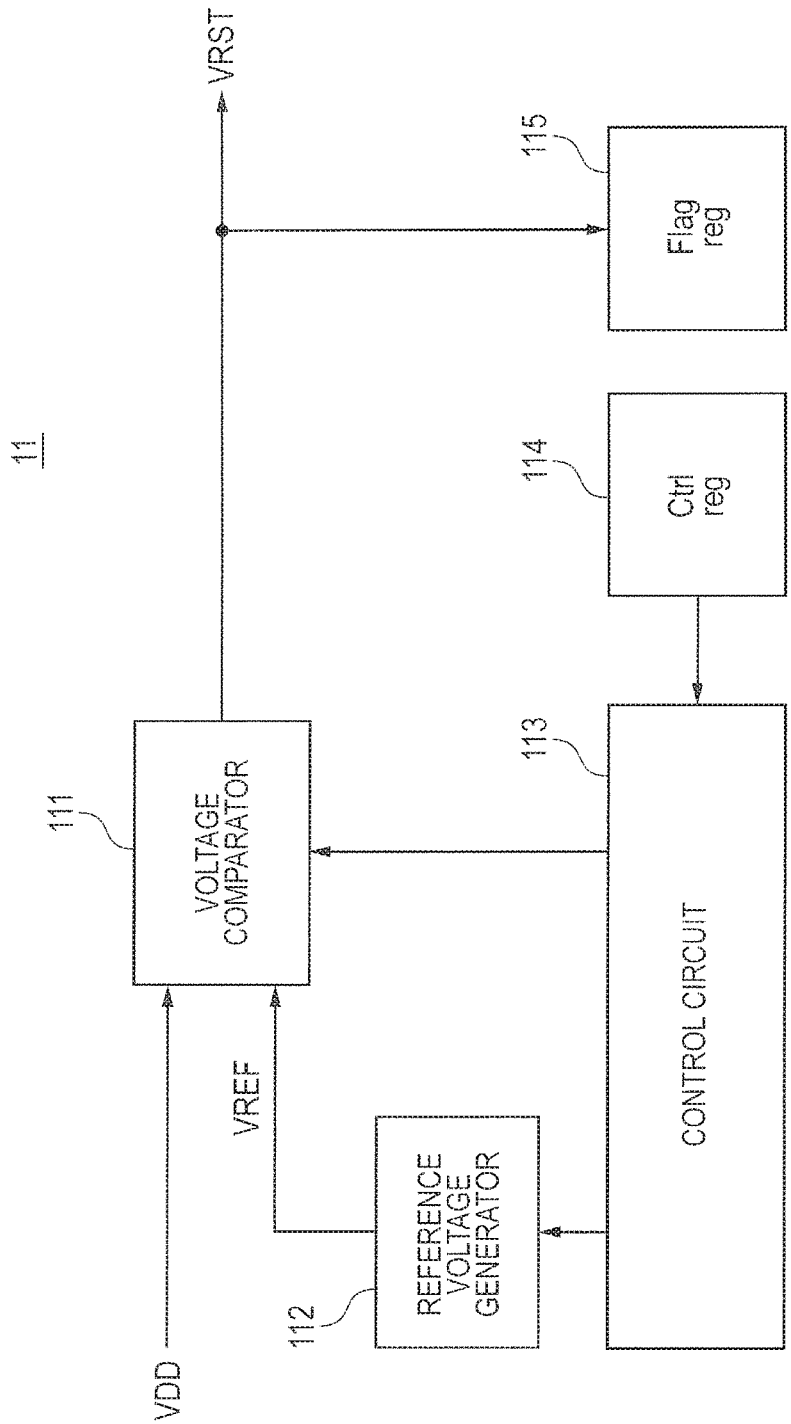
FIG. 3 is a block diagram illustrating a configuration example of a voltage monitor provided for the semiconductor system illustrated in FIG. 2.

FIG. 3 is a block diagram illustrating a configuration example of the voltage monitor 11.

Referring to FIG. 3, the voltage monitor 11 includes a voltage comparator 111, a reference voltage generator 112, a control circuit 113, a setup information storage register 114, and a flag storage register 115.

The setup information storage register 114 stores setup information that is needed for the voltage monitor 11 and is supplied from a CPU, for example. The control circuit 113 controls values of reference voltage VREF generated by the reference voltage generator 112 or comparison accuracy of the voltage comparator 111 based on the setup information stored in the setup information storage register 114. The voltage comparator 111 compares power-supply voltage VDD with reference voltage VREF from the reference voltage generator 112 and outputs reset signal VRST corresponding to a comparison result. The flag storage register 115 stores information (error flag) about reset signal VRST when activated. The information stored in the flag storage register 115 is retained even when the internal circuit 10 is initialized.

Reference voltage VREF is set to 0.9 V, for example. The voltage comparator 111 keeps reset signal VRST inactive when power-supply voltage VDD is higher than reference voltage VREF. The voltage comparator 111 activates reset signal VRST when power-supply voltage VDD is lower than or equal to reference voltage VREF.

Figure 4:
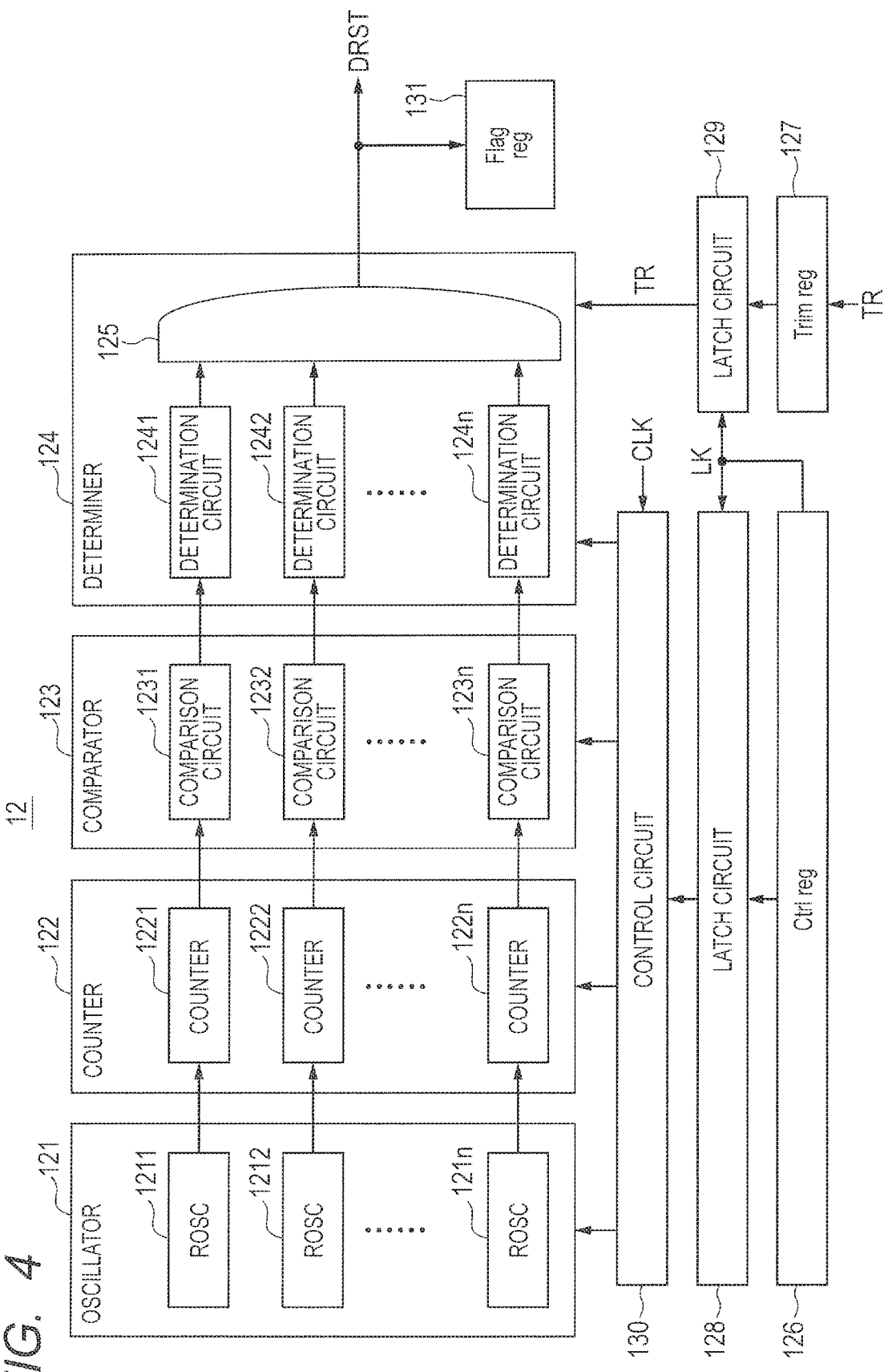
FIG. 4 is a block diagram illustrating a configuration example of a delay monitor provided for the semiconductor system illustrated in FIG. 2.

FIG. 4 is a block diagram illustrating a configuration example of the delay monitor 12.

Referring to FIG. 4, the delay monitor 12 includes an oscillator 121, a counter 122, a comparator 123, a determiner 124, a setup information storage register 126, a threshold value storage register 127, latch circuits 128 and 129, a control circuit 130, and a flag storage register 131.

The threshold value storage register 127 stores predetermined threshold value TR read from the flash memory 18. A method of determining threshold value TR to be stored in the flash memory 18 will be described later. The setup information storage register 126 stores setup information that is needed for the delay monitor 12 and is supplied from the CPU, for example.

Taking into consideration an accuracy error of the voltage monitor 11, the delay monitor 12 needs to operate even when power-supply voltage VDD is lower than 0.9 V. The latch circuits 128 and 129 therefore latch the information stored in the registers 126 and 127, respectively, in synchronization with lock signal LK from the setup information storage register 126, for example. It is possible to avoid an effect even if the registers 126 and 127 store unintended new information due to degradation of power-supply voltage VDD.

The control circuit 130 controls the oscillator 121, the counter 122, the comparator 123, and the determiner 124 based on the setup information latched by the latch circuit 128. Specifically, the control circuit 130 controls whether to drive the oscillator 121 or controls a count period for the counter 122, comparison accuracy of the comparator 123, or a determination criterion for the determiner 124.

The oscillator 121 is provided as a delay information generator including n paths, where n is a natural number, corresponding to critical paths for the internal circuit 10. For example, the oscillator 121 includes n ring oscillators 1211 through 121n that feature different temperature dependencies, voltage dependencies, and process dependencies and are configured by transistors used for the internal circuit 10. The delay monitor 12 monitors the number of oscillations (comparable to the signal propagation time) per predetermined period for the ring oscillators 1211 through 121n with different characteristics and thereby monitors whether the signal propagation time for the critical path in the internal circuit 10 falls within an allowable range.

The counter 122 counts the number of oscillations per predetermined period regarding the oscillator 121. Specifically, the counter 122 includes n counters 1221 through 122n. The counters 1221 through 122n each count the number of oscillations per predetermined period regarding the ring oscillators 1211 through 121n, respectively. A decrease in power-supply voltage VDD decreases the ring oscillator frequency and therefore decreases the number of oscillations per predetermined period.

The comparator 123 compares a count value of the counter 122 with predetermined threshold value TR. Specifically, the comparator 123 includes n comparison circuits 1231 through 123n. The comparison circuits 1231 through 123n each compare count values of the counters 1221 through 122n with predetermined corresponding n threshold values TR, respectively.

The determiner 124 outputs reset signal DRST corresponding to a comparison result from the comparator 123. Specifically, the determiner 124 includes n determination circuits 1241 through 124n and an AND circuit 125. The determination circuits 1241 through 124n each output determination results corresponding to comparison results from the comparison circuits 1231 through 123n, respectively.

For example, the determination circuits 1241 through 124n each output an H-level determination result when count values of the 1221 through 122n are larger than corresponding threshold values TR. The determination circuits 1241 through 124n each output an L-level determination result when count values of the 1221 through 122n are smaller than or equal to corresponding threshold values TR. The determination circuits 1241 through 124n each may output an L-level determination result when the number of occurrences to make the count value smaller than or equal to threshold value TR reaches a predetermined count.

The AND circuit 125 outputs reset signal DRST, namely, logical AND among determination results from the determination circuits 1241 through 124n. For example, the AND circuit 125 keeps reset signal DRST inactive (H level) when the determination circuits 1241 through 124n are all set to the H level. The AND circuit 125 activates reset signal DRST (L level) when at least one of the determination circuits 1241 through 124n goes to the L level.

The flag storage register 131 stores information (error flag) when reset signal DRST is activated. The information stored in the flag storage register 131 is retained even when the internal circuit 10 is initialized.

Returning to FIG. 2, the description follows.

The AND circuit 13 outputs logical AND between reset signal VRST from the voltage monitor 11 and reset signal DRST from the delay monitor 12. The reset control circuit 14 outputs reset signal RST corresponding to an output signal from the AND circuit 13. Reset signal RST, when active (L level), initializes the circuits in the VDD drive region 1 and is output as error signal ERR notifying the presence or absence of an error occurrence outside the semiconductor system SYS1. The reset control circuit 14 may be omitted if unnecessary. In this case, an output from the AND circuit 13 is used as reset signal RST.

The frequency information storage register 15 stores information about a frequency set to the main oscillator 17. This information is supplied from the CPU, for example. The control circuit 16 oscillates the main oscillator 17 based on the frequency information stored in the frequency information storage register 15. The main oscillator 17 thereby outputs clock signal CLK specified by the control circuit 16. This clock signal CLK is supplied to the internal circuit 10, the delay monitor 12, and the clock monitor 19, for example.

The clock monitor 19 monitors whether clock signal CLK from the main oscillator 17 satisfies an intended frequency. The CPU changes an operation clock after the clock monitor 19 confirms operation of clock signal CLK and the delay monitor 12 performs self-diagnosis. For example, the CPU changes the operation clock from a low-speed clock signal generated by built-in oscillator iOCO to a high-speed clock signal generated by multiplying clock signal CLK from the main oscillator 17 using PLL.

Lock signal LK output from the delay monitor 12 after the self-diagnosis locks the frequency information stored in the frequency information storage register 15. This can prevent the main oscillator 17 from oscillating at an unintended frequency due to degradation of power-supply voltage VDD.

(Structural Difference Between the Internal Circuit 10 and the Delay Monitor 12)

The description below explains a structural difference between the internal circuit 10 as a monitoring-targeted circuit and the delay monitor 12 that is driven by power-supply voltage VDD used in common with the internal circuit 10 and operates even at a voltage lower than that for the internal circuit 10.

Figure 5:
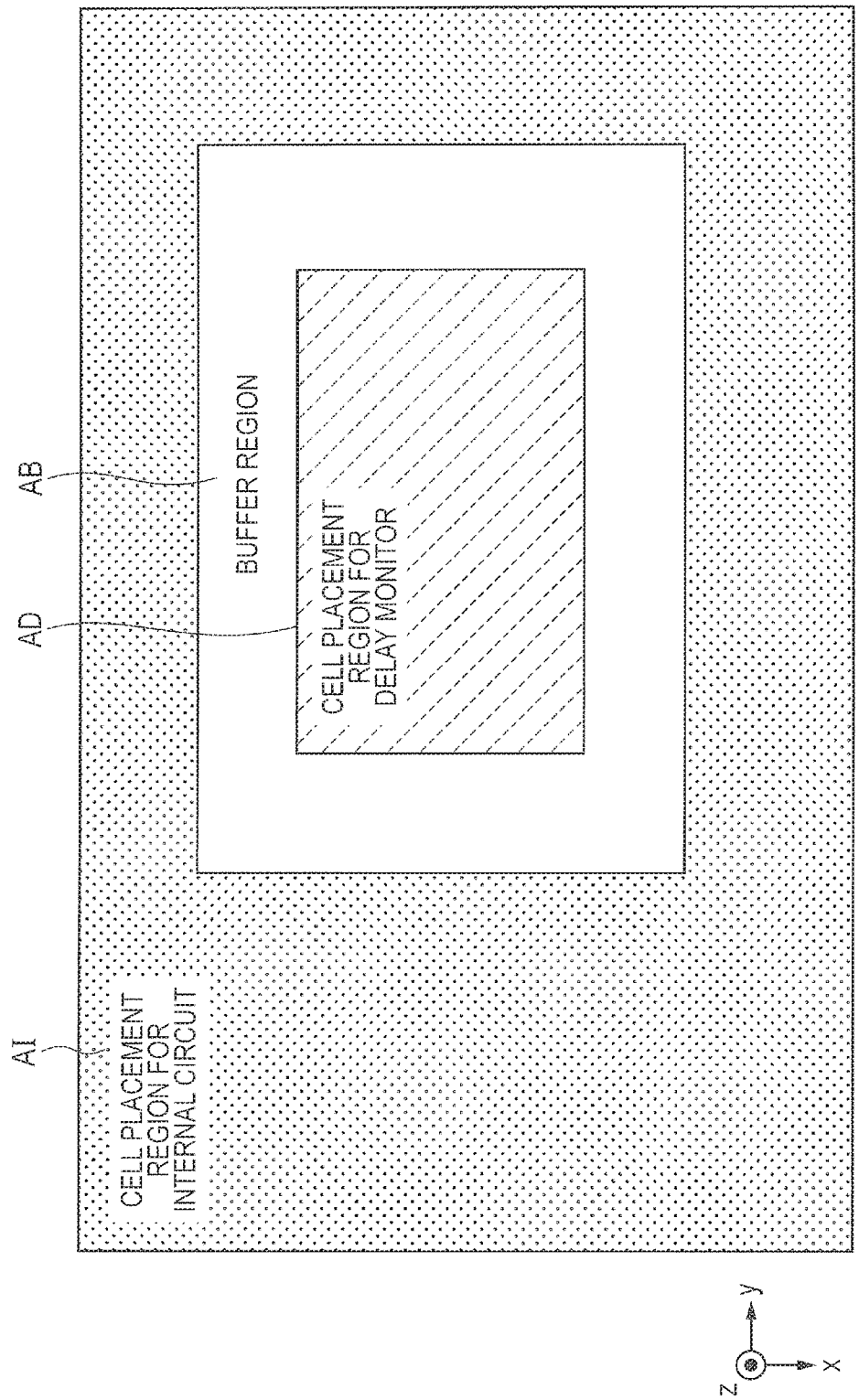
FIG. 5 is a schematic plan view of an internal circuit and the delay monitor.

FIG. 5 is a schematic plan view of the internal circuit 10 and the delay monitor 12. As illustrated in FIG. 5, a cell (namely, a transistor) for the internal circuit 10 is placed in most part of a cell placement region for the semiconductor system SYS1. A cell (namely, a transistor) for the delay monitor 12 is placed in a partial region surrounded by the most part of the same. A buffer region AB is provided between a cell placement region AI for the internal circuit 10 and a cell placement region AD for the delay monitor 12.

The delay monitor 12 is configured by a transistor having on-resistance lower than on-resistance of a transistor configuring the internal circuit 10 as a monitoring-targeted circuit. Compared to the internal circuit 10, the delay monitor 12 can reduce speed degradation due to a decrease in power-supply voltage VDD. A specific description is as follows.

(First Configuration Example of Transistors for the Internal Circuit 10 and the Delay Monitor 12)

Figure 6:
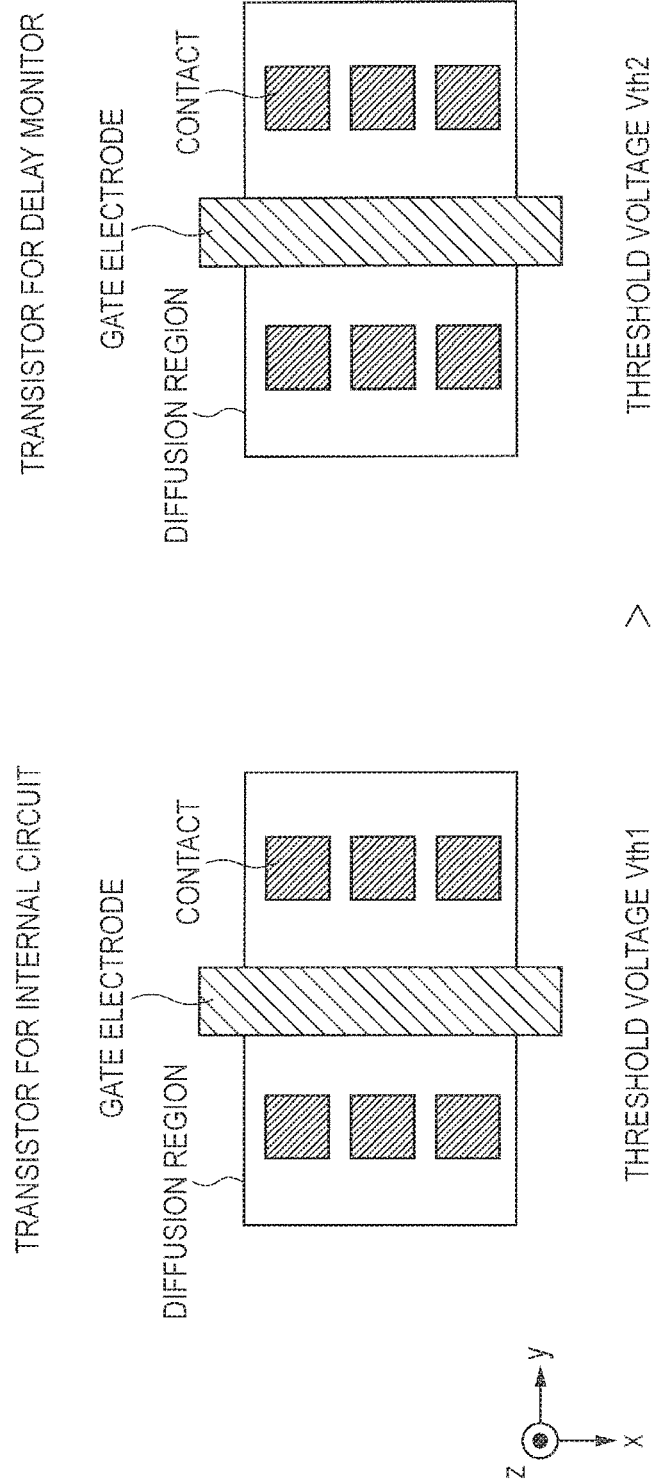
FIG. 6 is a schematic plan view illustrating a first configuration example of a transistor configuring the internal circuit and a transistor configuring the delay monitor.

FIG. 6 is a schematic plan view illustrating a first configuration example of each transistor configuring the internal circuit 10 and each transistor configuring the delay monitor 12. As illustrated in FIG. 6, the delay monitor 12 is configured by a transistor whose threshold voltage Vth2 is lower than threshold voltage Vth1 of a transistor configuring the internal circuit 10.

In more detail, threshold voltage Vth2 is specified for a transistor that belongs to a plurality of transistors configuring the delay monitor 12 and indicates the highest threshold voltage. Threshold voltage Vth1 is specified for a transistor that belongs to a plurality of transistors configuring the internal circuit 10 and indicates the highest threshold voltage. Threshold voltage Vth2 is lower than threshold voltage Vth1 when the other conditions than the threshold voltage are identical. More advantageously, threshold voltages for the transistors configuring the delay monitor 12 are all lower than threshold voltages for the transistors configuring the internal circuit 10. Compared to the internal circuit 10, the delay monitor 12 can reduce speed degradation due to a decrease in power-supply voltage VDD.

If the delay monitor 12 is unavailable, the internal circuit 10 needs to be configured by only transistors with threshold voltage Vth2 or lower in order to ensure low-voltage operation. A leakage power therefore increases if the delay monitor 12 is unavailable.

(Second Configuration Example of Transistors for the Internal Circuit 10 and the Delay Monitor 12)

Figure 7:
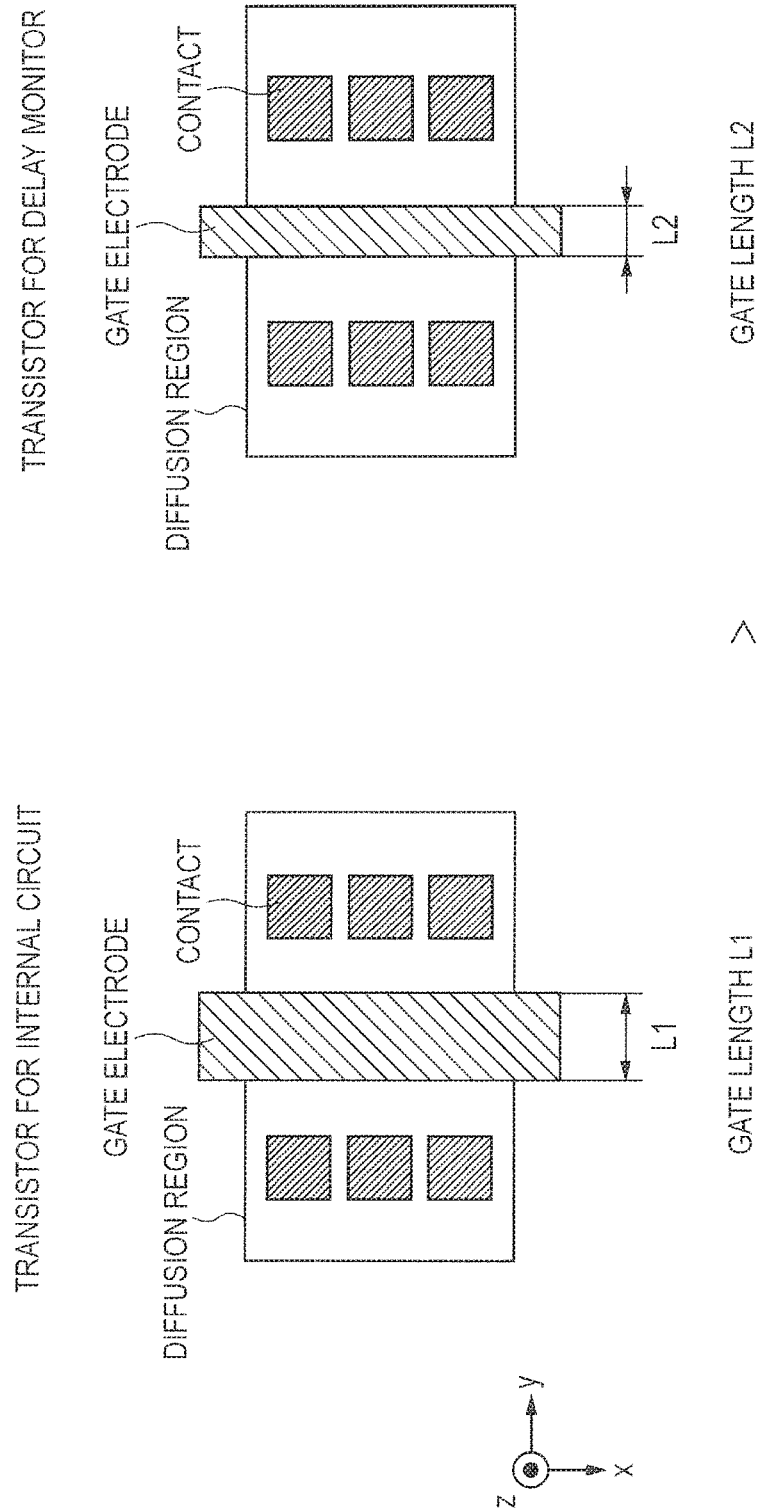
FIG. 7 is a schematic plan view illustrating a second configuration example of a transistor configuring the internal circuit and a transistor configuring the delay monitor.

FIG. 7 is a schematic plan view illustrating a second configuration example of each transistor configuring the internal circuit 10 and each transistor configuring the delay monitor 12. As illustrated in FIG. 7, the delay monitor 12 is configured by a transistor whose gate length L2 is shorter than gate length L1 of a transistor configuring the internal circuit 10.

In more detail, gate length L2 is specified for a transistor that belongs to a plurality of transistors configuring the delay monitor 12 and indicates the longest gate length. Gate length L1 is specified for a transistor that belongs to a plurality of transistors configuring the internal circuit 10 and indicates the longest gate length. Gate length L2 is shorter than gate length L1 when the other conditions than the gate length are identical. More advantageously, gate lengths for the transistors configuring the delay monitor 12 are all shorter than gate lengths for the transistors configuring the internal circuit 10. Compared to the internal circuit 10, the delay monitor 12 can reduce speed degradation due to a decrease in power-supply voltage VDD.

If the delay monitor 12 is unavailable, the internal circuit 10 needs to be configured by only transistors with gate length L2 or shorter in order to ensure low-voltage operation. A leakage power therefore increases if the delay monitor 12 is unavailable.

(Third Configuration Example of Transistors for the Internal Circuit 10 and the Delay Monitor 12)

Figure 8:
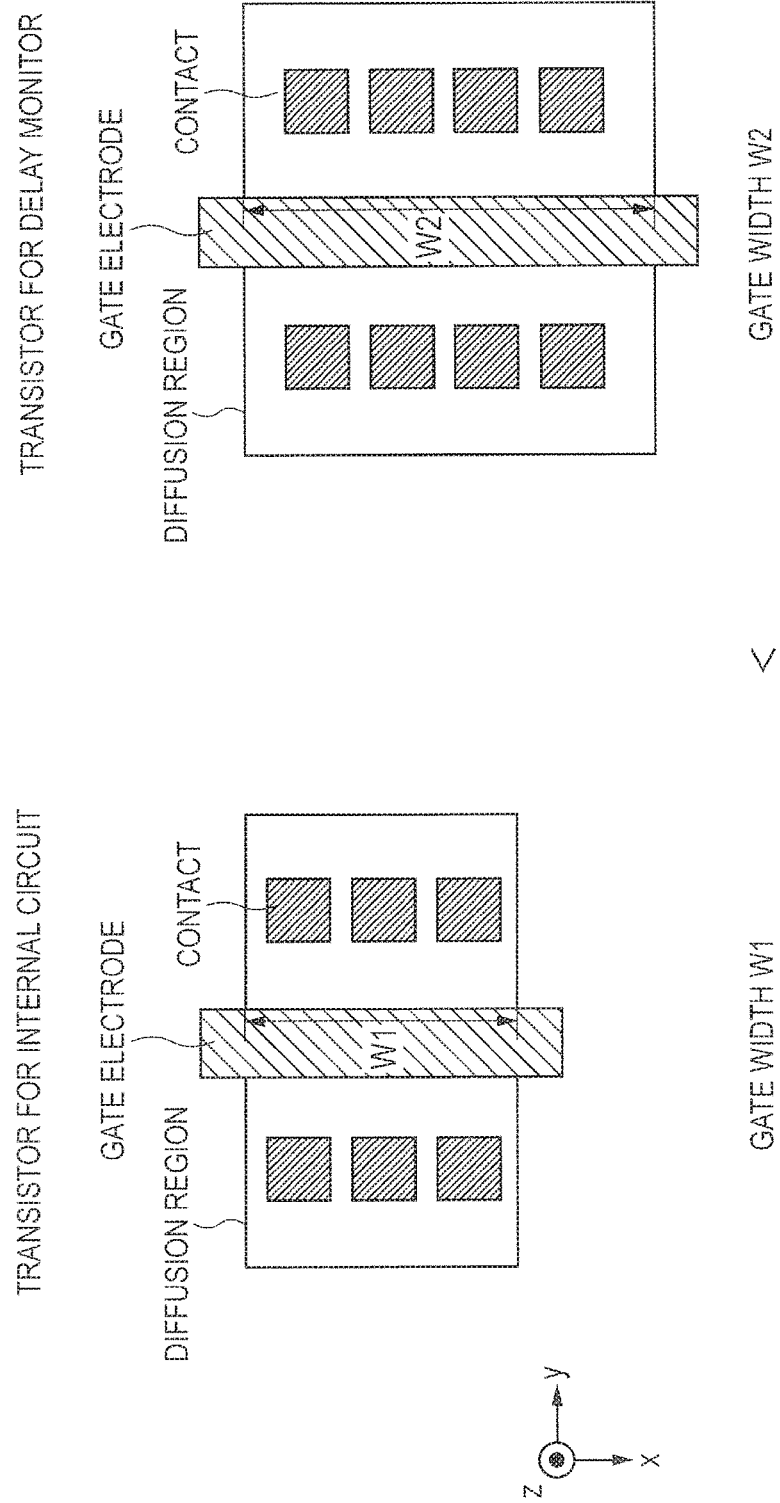
FIG. 8 is a schematic plan view illustrating a third configuration example of a transistor configuring the internal circuit and a transistor configuring the delay monitor.

FIG. 8 is a schematic plan view illustrating a third configuration example of each transistor configuring the internal circuit 10 and each transistor configuring the delay monitor 12. As illustrated in FIG. 8, the delay monitor 12 is configured by a transistor whose gate width W2 is wider than gate width W1 of a transistor configuring the internal circuit 10.

In more detail, gate width W2 is specified for a transistor that belongs to a plurality of transistors configuring the delay monitor 12 and indicates the smallest gate width. Gate width W1 is specified for a transistor that belongs to a plurality of transistors configuring the internal circuit 10 and indicates the smallest gate width. Gate width W2 is larger than gate width W1 when the other conditions than the gate width are identical. More advantageously, gate widths for the transistors configuring the delay monitor 12 are all larger than gate widths for the transistors configuring the internal circuit 10. Compared to the internal circuit 10, the delay monitor 12 can reduce speed degradation due to a decrease in power-supply voltage VDD.

If the delay monitor 12 is unavailable, the internal circuit 10 needs to be configured by only transistors with gate width W2 or larger in order to ensure low-voltage operation. A leakage power therefore increases or the circuit scale increases if the delay monitor 12 is unavailable.

(Fourth Configuration Example of Transistors for the Internal Circuit 10 and the Delay Monitor 12)

FIG. 9 is a schematic sectional view illustrating a fourth configuration example of each transistor configuring the internal circuit 10 and each transistor configuring the delay monitor 12. The example of FIG. 9 illustrates an NMOS transistor but the same applies to a PMOS transistor. As illustrated in FIG. 9, the delay monitor 12 is configured by a transistor whose gate oxide film Tox2 is thinner than gate oxide film Tox1 of a transistor configuring the internal circuit 10.

In more detail, gate oxide film Tox2 is specified for a transistor that belongs to a plurality of transistors configuring the delay monitor 12 and indicates the thickest gate oxide film. Gate oxide film Tox1 is specified for a transistor that belongs to a plurality of transistors configuring the internal circuit 10 and indicates the thickest gate oxide film. Gate oxide film Tox2 is thinner than gate oxide film Tox1 when the other conditions than the gate oxide film are identical. More advantageously, gate oxide films of the transistors configuring the delay monitor 12 are all thinner than gate oxide films of the transistors configuring the internal circuit 10. Compared to the internal circuit 10, the delay monitor 12 can reduce speed degradation due to a decrease in power-supply voltage VDD.

If the delay monitor 12 is unavailable, the internal circuit 10 needs to be configured by only transistors using gate oxide film Tox2 or thinner in order to ensure low-voltage operation. A leakage power therefore increases if the delay monitor 12 is unavailable.

(Different Timing Tolerances for the Internal Circuit 10 and the Delay Monitor 12)

Figure 10:
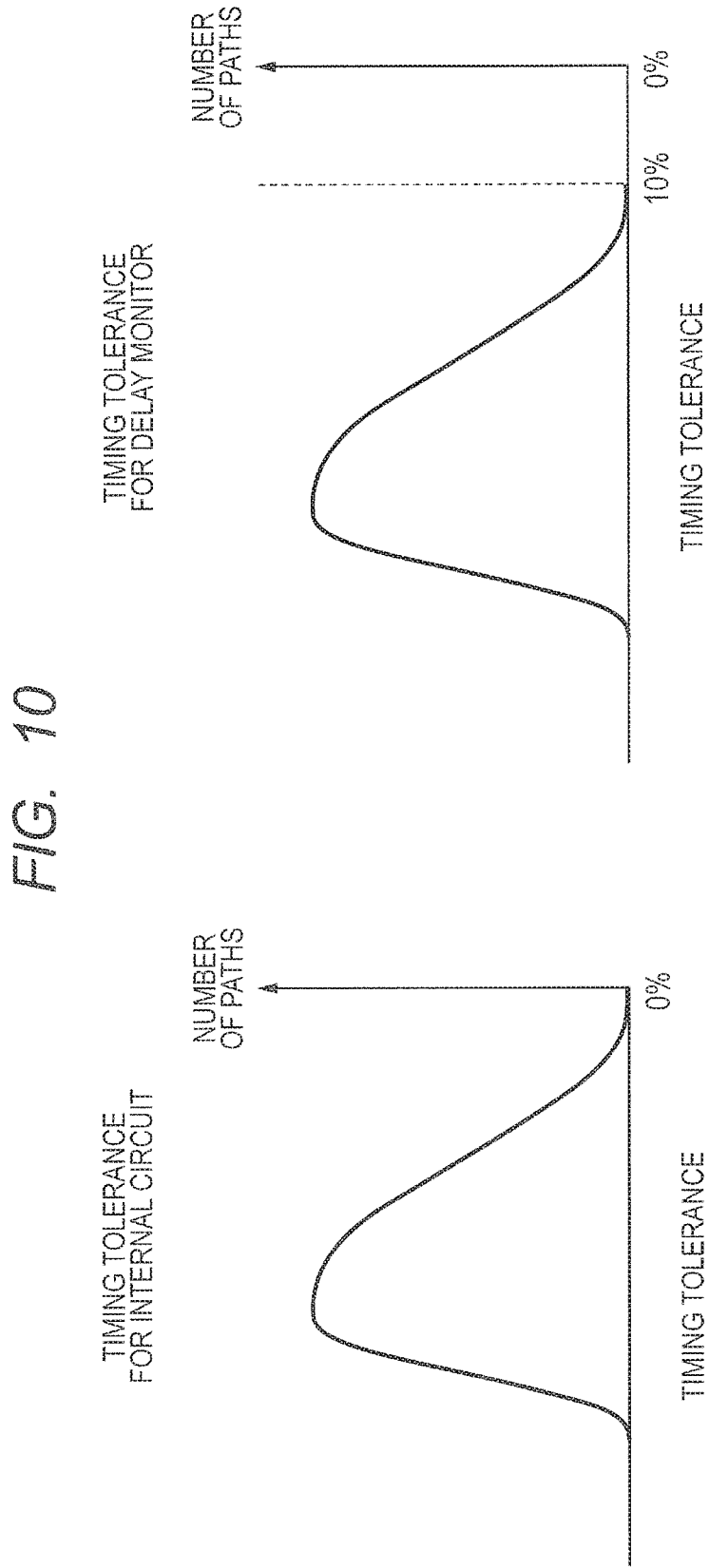
FIG. 10 is a diagram illustrating a timing tolerance corresponding to each path of the internal circuit and a timing tolerance corresponding to each path of the delay monitor.

FIG. 10 is a diagram illustrating a timing tolerance corresponding to each path of the internal circuit 10 and a timing tolerance corresponding to each path of the delay monitor 12. The timing tolerance here signifies a tolerance applied to the setup time and the hold time settled for each path, for example.

As illustrated in FIG. 10, the timing tolerance for each path of the delay monitor 12 is designed to be larger than the timing tolerance for each of the internal circuit 10 by approximately 10%. Compared to the internal circuit 10, the delay monitor 12 can reduce speed degradation due to a decrease in power-supply voltage VDD.

If the delay monitor 12 is unavailable, the internal circuit 10 needs to increase timing tolerances for all the paths by increasing transistor sizes or using transistors with low threshold voltages in order to ensure low-voltage operation. A leakage power therefore increases or the circuit scale increases if the delay monitor 12 is unavailable.

(Protection Against Noise for the Delay Monitor 12)

The description below explains protection against noise for the delay monitor 12. As described below, the delay monitor 12 can reliably operate even at a low voltage by suppressing a noise propagated to the delay monitor 12 from the internal circuit 10. A specific description is as follows.

First Placement Example of the Semiconductor System SYS1

Figure 11:
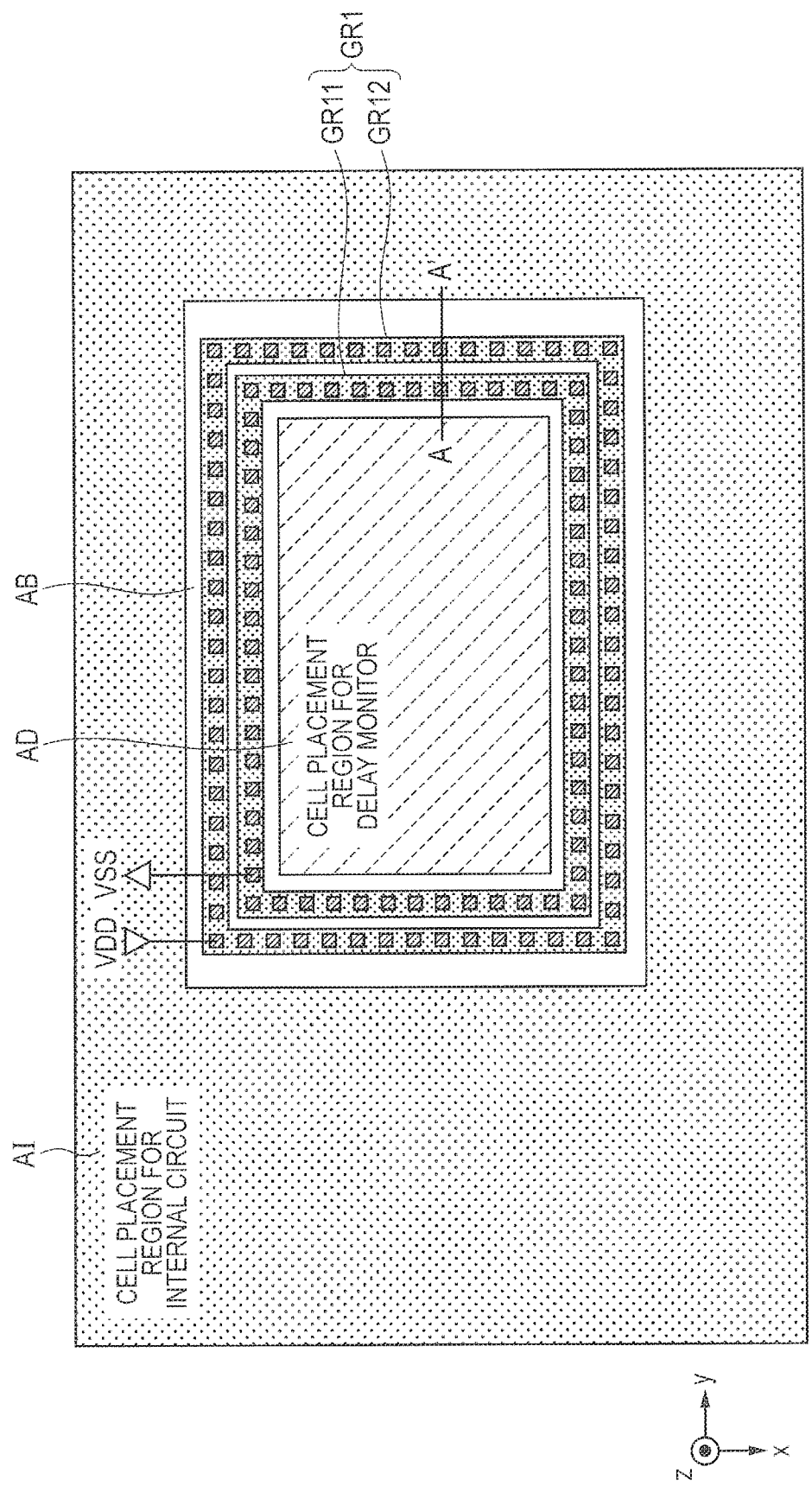
FIG. 11 is a schematic plan view illustrating a first placement example of the internal circuit, the delay monitor, and a guard ring provided therebetween.
Figure 12:
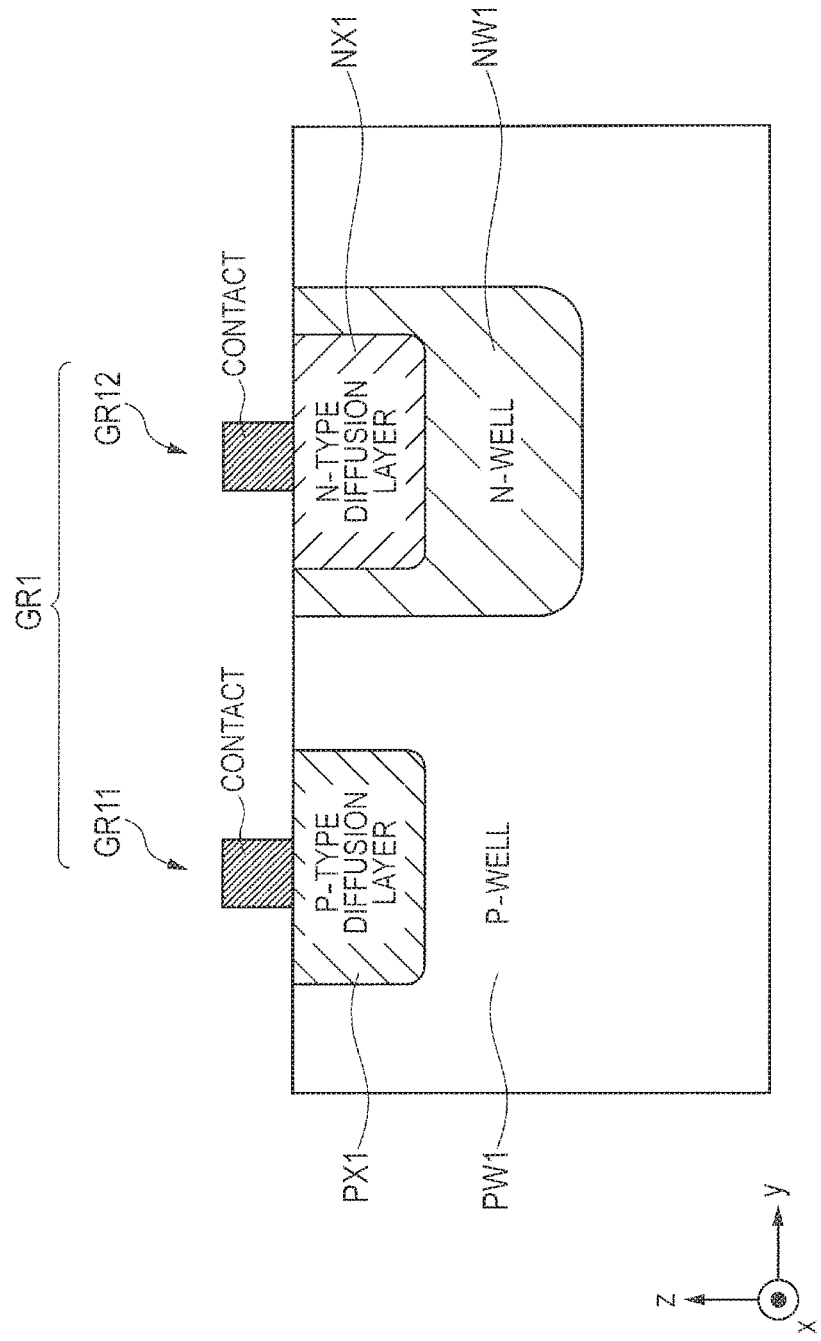
FIG. 12 is a schematic sectional view taken along the line A-A' of the guard ring illustrated in FIG. 11.

FIG. 11 is a schematic plan view illustrating a first placement example of the internal circuit 10, the delay monitor 12, and a guard ring GR1 provided for the semiconductor system SYS1. FIG. 12 is a schematic sectional view taken along the line A-A' of the guard ring GR1 illustrated in FIG. 11.

As illustrated in FIG. 11, a cell for the internal circuit 10 is placed in most part of the cell placement region for the semiconductor system SYS1. A cell for the delay monitor 12 is placed in a partial region surrounded by the most part of the same. Buffer region (including dummy cells) AB is provided between the cell placement region AI for the internal circuit 10 and the cell placement region AD for the delay monitor 12.

The guard ring GR1 is placed in the buffer region AB to surround the delay monitor 12. According to the present example, the guard ring GR1 is configured by guard rings GR11 and GR12.

Referring to FIG. 12, the guard ring GR11 is configured by a P-type diffusion layer PX1 that is formed by doping the surface of a P-well PW1 with P-type impurities. A plurality of contacts are placed over the P-type guard ring GR11. Ground voltage VSS is supplied via the contacts. The guard ring GR12 is configured by an N-type diffusion layer NX1 that is formed by doping the surface of an N-well NW1 with N-type impurities. A plurality of contacts are placed over the N-type guard ring GR12. Power-supply voltage VDD is supplied via the contacts.

As above, provision of the guard ring GR1 between the internal circuit 10 and the delay monitor 12 suppresses propagation of a noise from the internal circuit 10 to the delay monitor 12. The delay monitor 12 can thereby reliably operate even at a low voltage without an effect of the noise from the internal circuit 10.

There has been described the present example in which the guard ring GR1 is configured by the guard rings GR11 and GR12, but not limited thereto. The guard ring GR1 may be configured by only one of the guard rings GR11 and GR12.

Second Placement Example of the Semiconductor System SYS1

Figure 13:
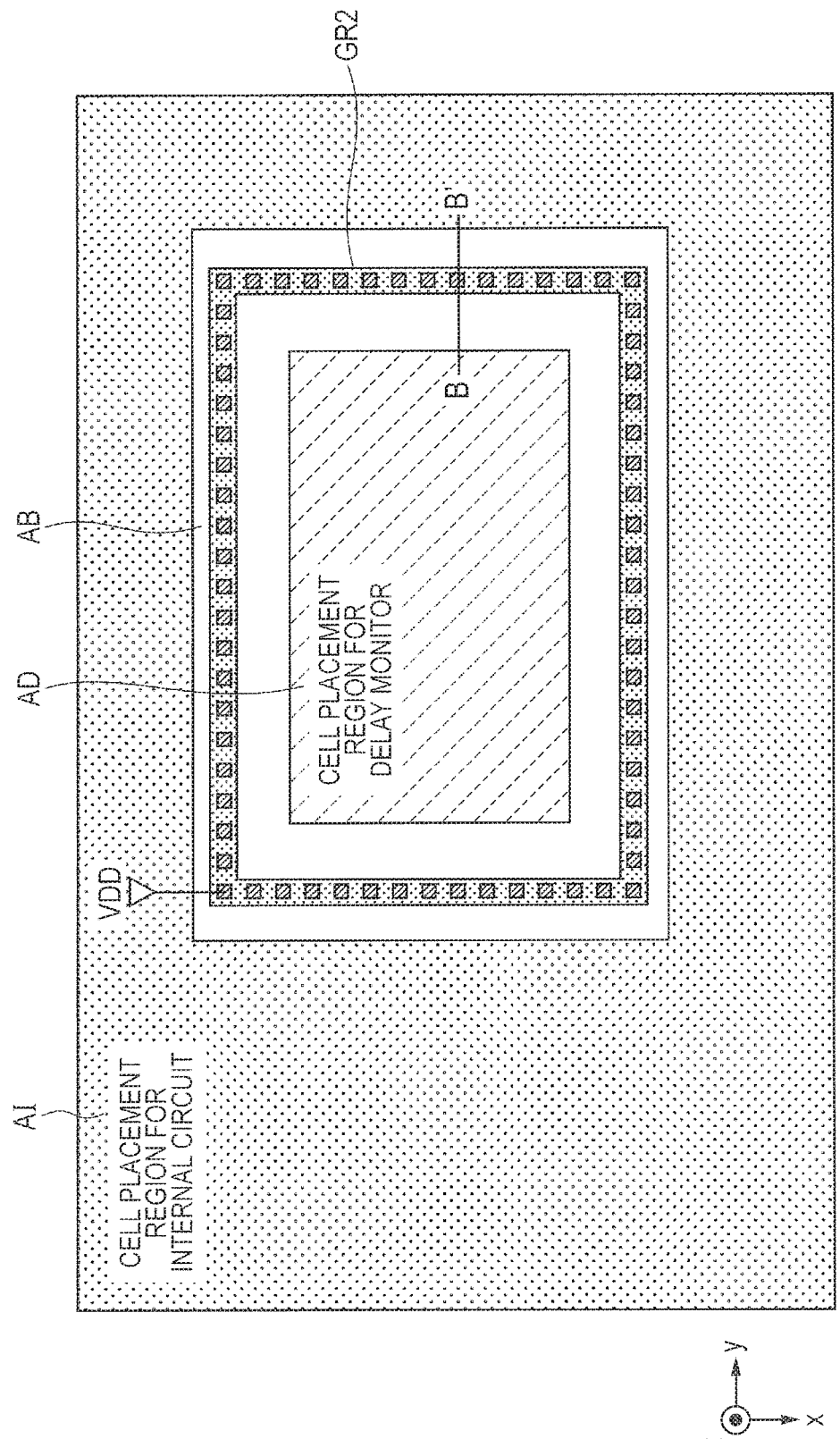
FIG. 13 is a schematic plan view illustrating a second placement example of the internal circuit, the delay monitor, and the guard ring provided therebetween.
Figure 14:
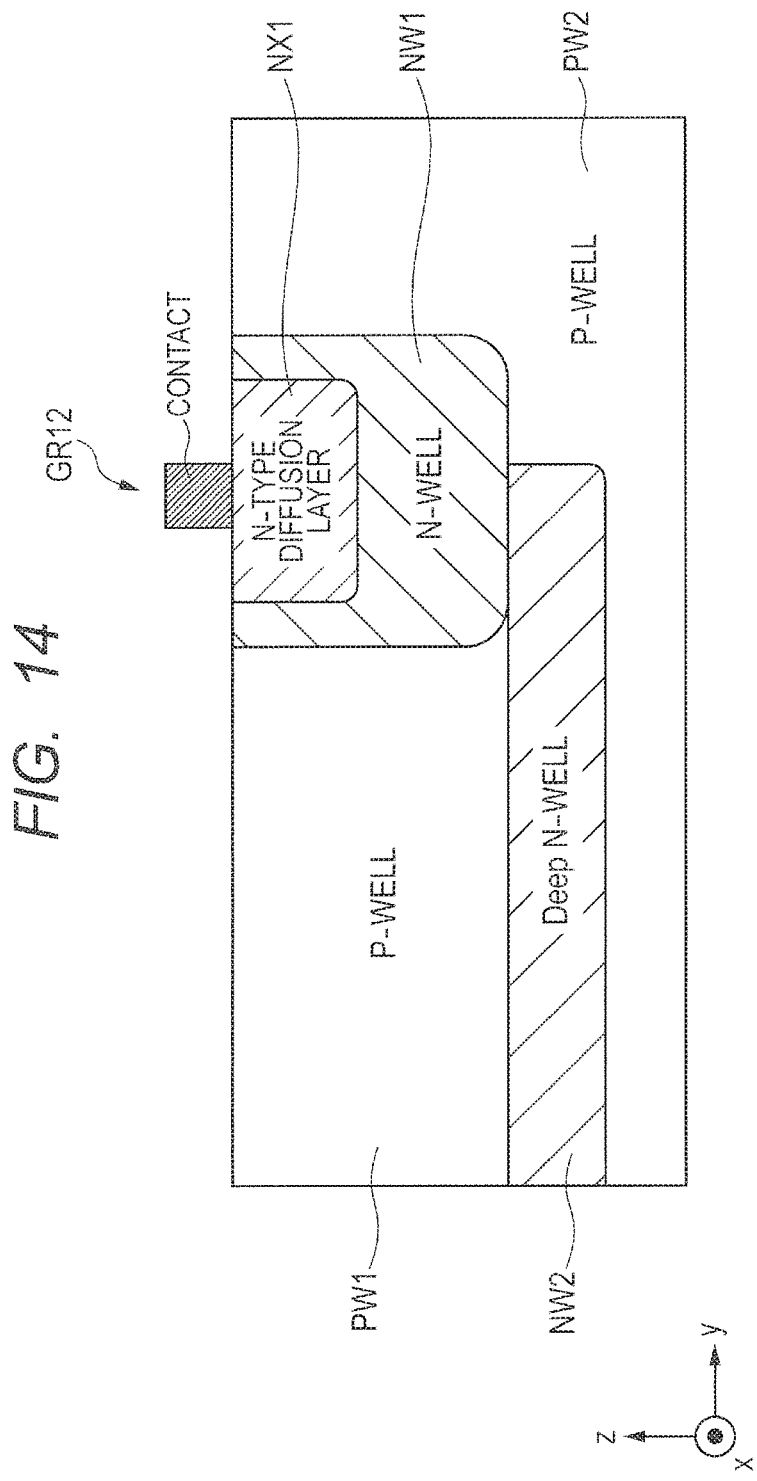
FIG. 14 is a schematic sectional view taken along the line B-B' of the guard ring illustrated in FIG. 13.

FIG. 13 is a schematic plan view illustrating a second placement example of the internal circuit 10, the delay monitor 12, and a guard ring GR2 provided for the semiconductor system SYS1. FIG. 14 is a schematic sectional view taken along the line B-B' of the guard ring GR2 illustrated in FIG. 13.

As illustrated in FIG. 13, the guard ring GR2 is placed in the buffer region AB to surround the delay monitor 12.

Referring to FIG. 14, the guard ring GR2 is configured by the N-type diffusion layer NX1 that is formed by doping the surface of the N-well with N-type impurities. A plurality of contacts are placed in the N-type guard ring GR2. Power-supply voltage VDD is supplied via the contacts.

A Deep N-well NW2 is formed at a layer below the N-well NW1 so as to cover a region surrounded by the guard ring GR2. Referring to FIG. 14, the P-well PW1 surrounded by the N-well NW1 and the Deep N-well NW2 is electrically separated from the remaining P-well PW2.

As above, the guard ring GR2 is provided between the internal circuit 10 and the delay monitor 12. In addition, the Deep N-well NW2 is used to electrically separate the P-well PW1 formed in the region inside the guard ring GR2 from the P-well PW2 formed in the region outside the guard ring GR2. This further suppresses propagation of a noise from the internal circuit 10 to the delay monitor 12. The delay monitor 12 can thereby reliably operate even at a low voltage without an effect of the noise from the internal circuit 10.

First Wiring Example for the Semiconductor System SYS1

Figure 15:
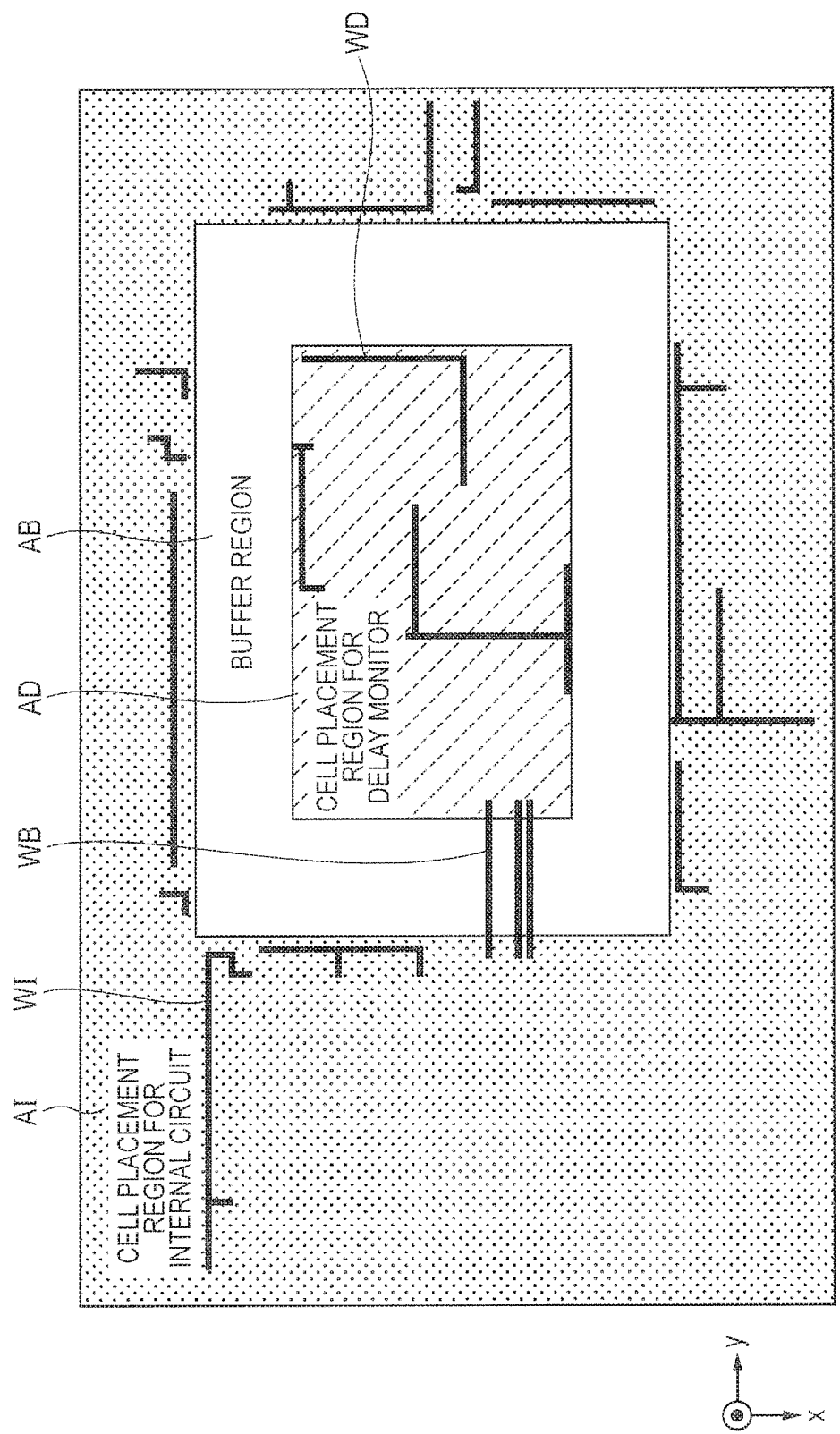
FIG. 15 is a schematic plan view illustrating a first wiring example of the internal circuit, the delay monitor, and a signal wiring therebetween.

FIG. 15 is a schematic plan view illustrating a first wiring example of the internal circuit 10, the delay monitor 12, and a signal wiring therebetween provided for the semiconductor system SYS1.

As illustrated in FIG. 15, the cell placement region AI of the internal circuit 10 is provided with a signal wiring WI of the internal circuit 10. The cell placement region AD of the delay monitor 12 is provided with a signal wiring WD of the delay monitor 12. The buffer region AB is not provided with the signal wirings WI and WD but is provided with only part of a signal wiring WB to exchange signals between the internal circuit 10 and the delay monitor 12.

The buffer region AB not provided with the signal wirings WI and WD is provided between the internal circuit 10 and the delay monitor 12, thereby suppressing propagation of a crosstalk noise from the signal wiring WI of the internal circuit 10 to the signal wiring WD of the delay monitor 12. The delay monitor 12 can thereby reliably operate even at a low voltage without an effect of the crosstalk noise from the internal circuit 10.

Second Wiring Example for the Semiconductor System SYS1

Figure 16:
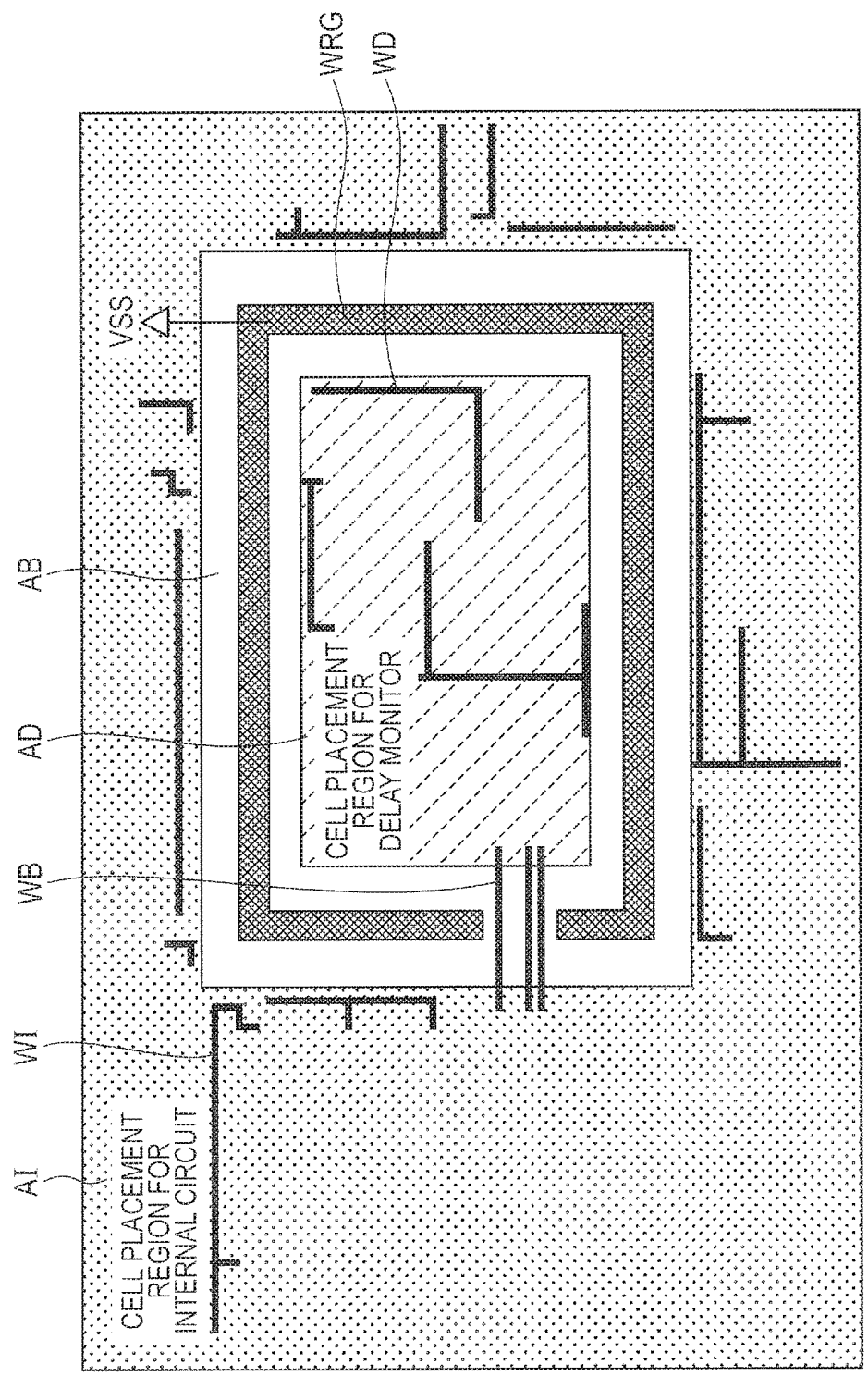
FIG. 16 is a schematic plan view illustrating a second wiring example of the internal circuit, the delay monitor, and a signal wiring therebetween.

FIG. 16 is a schematic plan view illustrating a second wiring example of the internal circuit 10, the delay monitor 12, and a signal wiring therebetween provided for the semiconductor system SYS1.

According to the configuration as illustrated in FIG. 16, the buffer region AB is provided with a dummy wiring WRG fixed to ground voltage VSS so as to enclose an outer periphery of the delay monitor 12. However, the dummy wiring WRG is not provided for a wiring region of the signal wiring WB to exchange signals between the internal circuit 10 and the delay monitor 12. The other configurations equal to those in FIG. 15 and a description about the configuration is omitted.

As above, the dummy wiring WRG fixed to ground voltage VSS is provided over the buffer region AB so as to enclose the outer periphery of the delay monitor 12, thereby further suppressing propagation of a crosstalk noise from the signal wiring WI of the internal circuit 10 to the signal wiring WD of the delay monitor 12. The delay monitor 12 can thereby more reliably operate even at a low voltage.

Specific Example of the Delay Monitor 12

The delay monitor 12 will be described in more detail by using a specific example.

Figure 17:
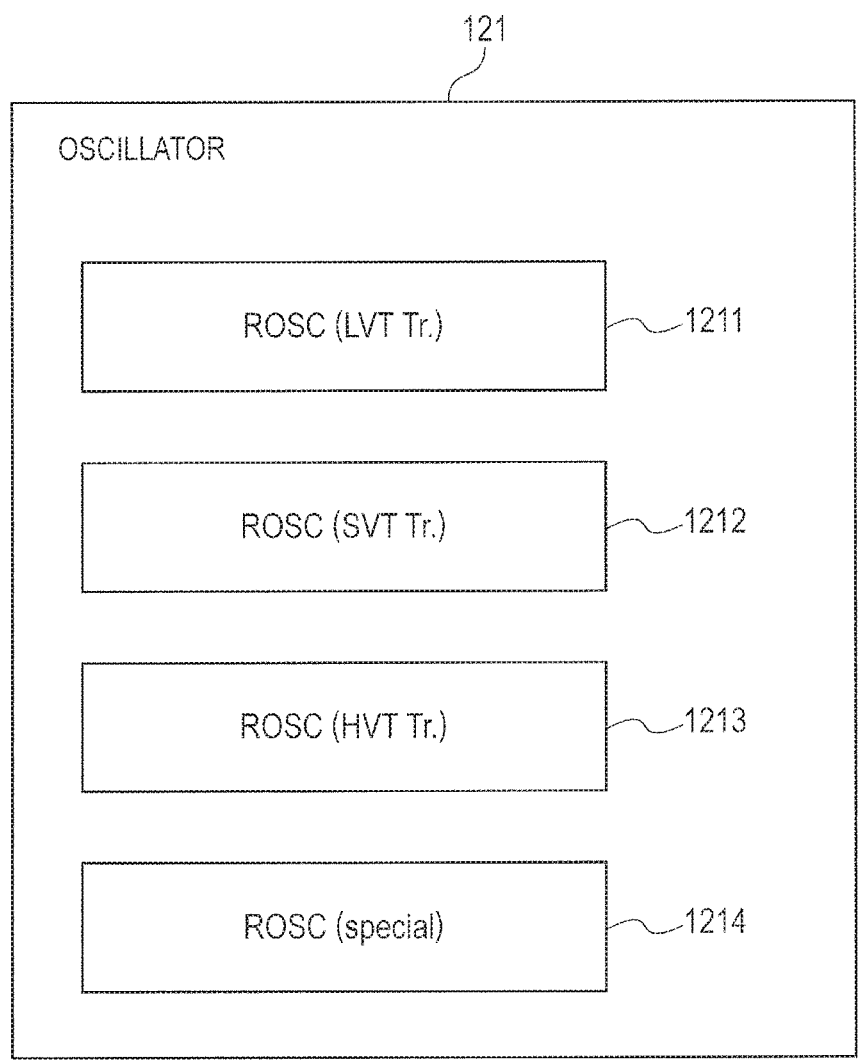
FIG. 17 is a block diagram illustrating a configuration example of an oscillator provided for the delay monitor illustrated in FIG. 4.

FIG. 17 is a block diagram illustrating a specific example of the oscillator 121.

According to the example in FIG. 17, the oscillator 121 includes four ring oscillators 1211 through 1214. For example, the ring oscillator 1211 is configured by a transistor whose threshold voltage LVT is lowest in three types of threshold voltages specified for transistors used for the internal circuit 10. The ring oscillator 1212 is configured by a transistor whose threshold voltage SVT is medium. The ring oscillator 1213 is configured by a transistor whose threshold voltage HVT is highest. The ring oscillator 1214 is configured to have the temperature dependency opposite to that of the ring oscillators 1211 through 1213. The ring oscillator 1214 is provided on the assumption that there is a critical path having the temperature dependency opposite to that of the ring oscillators 1211 through 1213.

Figure 18:
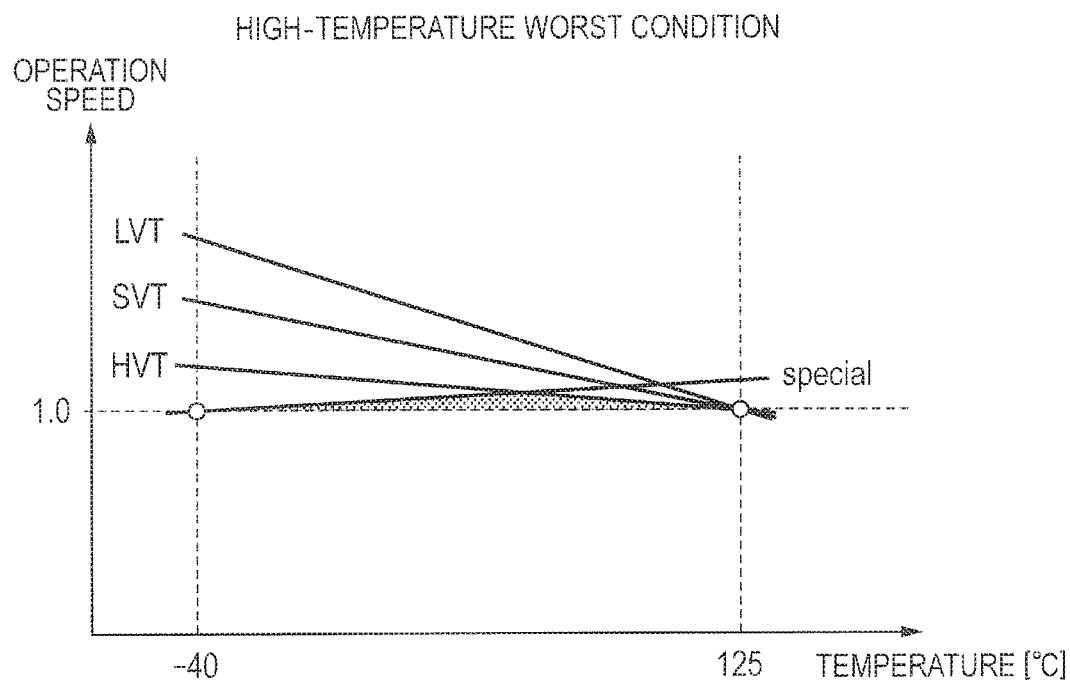
FIG. 18 is a diagram illustrating relation between a temperature and an operation speed under a high-temperature worst condition of each ring oscillator provided for the oscillator illustrated in FIG. 17.
Figure 19:
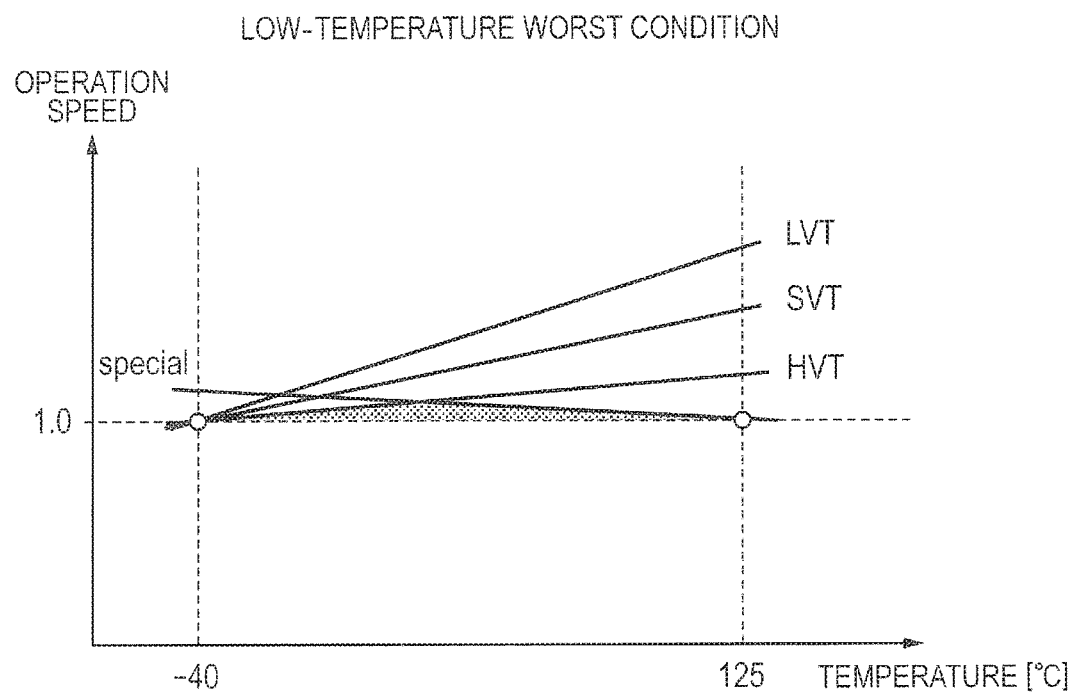
FIG. 19 is a diagram illustrating relation between a temperature and an operation speed under a low-temperature worst condition of each ring oscillator provided for the oscillator illustrated in FIG. 17.

FIG. 18 is a diagram illustrating relation between a temperature and an operation speed under a high-temperature worst condition of the ring oscillators 1211 through 1214. FIG. 19 is a diagram illustrating relation between a temperature and an operation speed under a low-temperature worst condition of the ring oscillators 1211 through 1214. The operation speed of the ring oscillator signifies an operating frequency. Increasing the operation speed increases the number of oscillations (count value) per predetermined period. Decreasing the operation speed decreases the number of oscillations (count value) per predetermined period.

Under the high-temperature worst condition illustrated in FIG. 18, the operation speeds of the ring oscillators 1211 through 1213 decrease with the increasing temperature and increase with the decreasing temperature. By way of exception, however, the operation speed of the ring oscillator 1214 having the opposite temperature dependency produces an inverse effect.

Trimming is therefore performed at a high temperature (125° C.) causing a lowest operation speed to determine a threshold value settled correspondingly to the number of oscillations for each of the ring oscillators 1211 through 1213. Contrastingly, trimming is performed at a low temperature (−40° C.) causing a lowest operation speed to determine a threshold value settled correspondingly to the number of oscillations for the ring oscillator 1214.

Under the low-temperature worst condition illustrated in FIG. 19, the operation speeds of the ring oscillators 1211 through 1213 increase with the increasing temperature and decrease with the decreasing temperature. By way of exception, however, the operation speed of the ring oscillator 1214 having the opposite temperature dependency produces an inverse effect.

Trimming is therefore performed at a low temperature (−40° C.) causing a lowest operation speed to determine a threshold value settled correspondingly to the number of oscillations for each of the ring oscillators 1211 through 1213. Contrastingly, trimming is performed at a high temperature (125° C.) causing a lowest operation speed to determine a threshold value settled correspondingly to the number of oscillations for the ring oscillator 1214.

Specific Configuration Examples of the Ring Oscillators 1211 Through 1213

FIG. 20 is a diagram illustrating a specific configuration example of the ring oscillator 1211 represented by a ring oscillator 1211a. The ring oscillator 1211a is configured by a transistor having lowest threshold voltage LVT.

As illustrated in FIG. 20, the ring oscillator 1211a includes five sets of NAND circuits ND1 through ND5 and NOR circuits NR1 through NR5 each, a NAND circuit ND0, and a buffer BF1. The NAND circuits and the NOR circuits each are not limited to the five sets but can be changed to any number of sets.

The NAND circuits ND1 through ND5 and the NOR circuits NR1 through NR5 are alternately provided in the form of a ring. The NAND circuit ND0 is provided for the ring formed of the NAND circuits ND1 through ND5 and the NOR circuits NR1 through NR5 and uses enable signal En from outside to control the presence or absence of oscillation. The buffer BF1 outputs oscillation signal ROUT representing a voltage of a node belonging to the ring.

The ring oscillator 1211a is asymmetrically structured to suppress an accuracy error due to aging degradation. Specifically, a drive capability of each of the NOR circuits NR1 through NR5 is approximately nine times larger than that of each of the NAND circuits ND1 through ND5. The drive capability of a PMOS transistor is increased to reduce an effect of NBTI (Negative Bias Temperature Instability) degradation as a major part of the aging degradation and thereby decrease a ratio of a rising period in one cycle of an oscillation signal. The ring oscillator 1211a can thereby suppress an increase of the accuracy error due to the NBTI degradation as a major part of the aging degradation.

The NMOS transistor is easily prone to HCI (Hot Carrier Injection) degradation that is likely to degrade the falling period for the oscillation signal. However, the NAND circuit having a long falling period includes a plurality of vertically placed NMOS transistors, uses a small source-drain voltage for each NMOS transistor, and is therefore hardly prone to an effect of the HCI degradation. The ring oscillator 1211a can therefore suppress an increase of the accuracy error due to the HCI degradation.

Except the use of the transistors having threshold voltages SVT and HVT, the ring oscillators 1212 and 1213 are configured equally to the ring oscillator 1212a and a description about the configuration is omitted.

First Specific Configuration Example of the Ring Oscillator 1214

Figure 21:
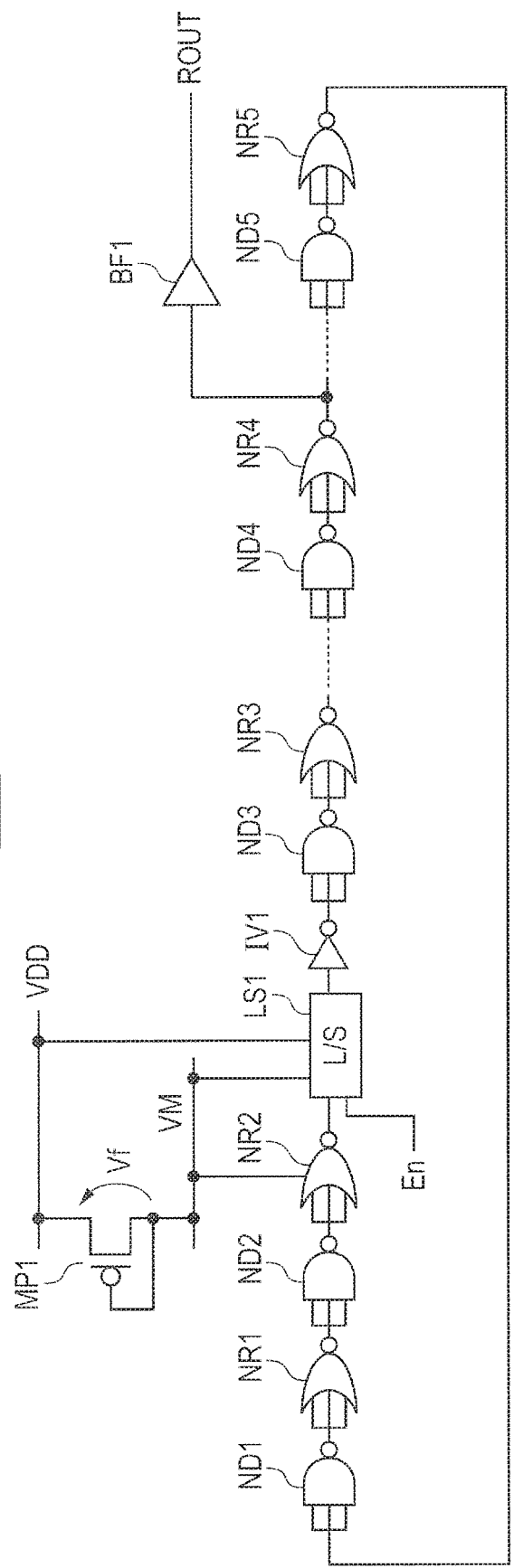
FIG. 21 is a diagram illustrating a specific configuration example of the ring oscillator provided for the oscillator illustrated in FIG. 17.

FIG. 21 is a diagram illustrating a first specific configuration example of the ring oscillator 1214 represented by a ring oscillator 1214a. The example in FIG. 21 uses a transistor having the high-temperature worst temperature dependency to provide the ring oscillator 1214a having the inverse temperature dependency.

As illustrated in FIG. 21, the ring oscillator 1214a includes five sets of NAND circuits ND1 through ND5 and NOR circuits NR1 through NR5 each, a level shifter LS1, an inverter IV1, a PMOS transistor (hereinafter referred to simply as a transistor) MP1, and the buffer BF1. The NAND circuits and the NOR circuits each are not limited to the five sets but can be changed to any number of sets.

The NAND circuits ND1 through ND5 and the NOR circuits NR1 through NR5 are alternately provided in the form of a ring. The level shifter LS1 is provided for the ring formed of the NAND circuits ND1 through ND5 and the NOR circuits NR1 through NR5 and uses enable signal En from outside to control the presence or absence of level shift (namely, oscillation). The inverter IV1 outputs an inversion signal for an output from the level shifter LS1. According to the example in FIG. 21, the level shifter LS1 and the inverter IV1 are provided between the NOR circuit NR2 and the NAND circuit ND3. The transistor MP1 is diode-coupled between a line for power-supply voltage VDD and a line for intermediate voltage VM. The NOR circuit NR2 is driven by intermediate voltage VM instead of power-supply voltage VDD. The buffer BF1 outputs oscillation signal ROUT representing a voltage of a node belonging to the ring.

At a high temperature, drop voltage Vf for a diode decreases and intermediate voltage VM increases, thus increasing the amount of current supplied to the NOR circuit NR2. As a result, an oscillation frequency of the ring oscillator 1214*a* increases. At a low temperature, however, drop voltage Vf for the diode increases and intermediate voltage VM decreases, thus decreasing the amount of current supplied to the NOR circuit NR2. As a result, the oscillation frequency of the ring oscillator 1214*a* decreases. Namely, the ring oscillator 1214*a* can be given the low-temperature worst temperature dependency causing the oscillation frequency (the number of oscillations per predetermined period) to decrease as the temperature decreases despite under the high-temperature worst condition.

Second Specific Configuration Example of the Ring Oscillator 1214

Figure 22:
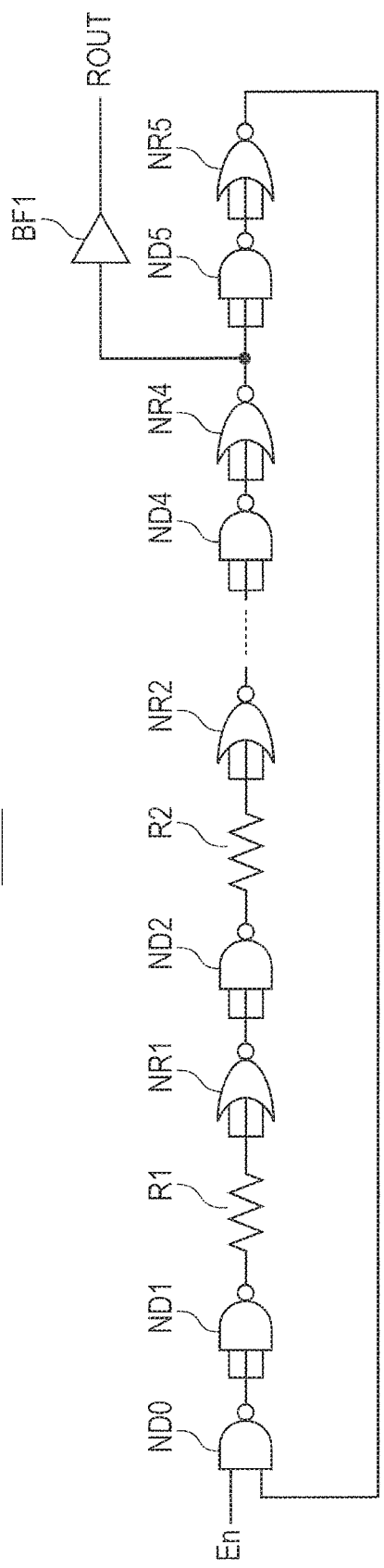
FIG. 22 is a diagram illustrating a specific configuration example of the ring oscillator provided for the oscillator illustrated in FIG. 17.

FIG. 22 is a diagram illustrating a second specific configuration example of the ring oscillator 1214 represented by a ring oscillator 1214*b*. The example in FIG. 22 uses a transistor having the low-temperature worst temperature dependency to provide the ring oscillator 1214*b* having the inverse temperature dependency.

As illustrated in FIG. 22, the ring oscillator 1214*b* includes five sets of NAND circuits ND1 through ND5 and NOR circuits NR1 through NR5 each, the NAND circuit ND0, resistive elements R1 and R2, and the buffer BF1. The NAND circuits and the NOR circuits each are not limited to the five sets but can be changed to any number of sets.

The NAND circuits ND1 through ND5 and the NOR circuits NR1 through NR5 are alternately provided in the form of a ring. The NAND circuit ND0 is provided for the ring formed of the NAND circuits ND1 through ND5 and the NOR circuits NR1 through NR5 and uses enable signal En from outside to control the presence or absence of oscillation. The resistive elements R1 and R2 are also provided for the ring. The buffer BF1 outputs oscillation signal ROUT representing a voltage of a node belonging to the ring.

A high temperature increases a signal propagation delay for the resistive elements R1 and R2, thus decreasing the oscillation frequency of the ring oscillator 1214*b*. Contrastingly, a low temperature decreases a signal propagation delay for the resistive elements R1 and R2, thus increasing the oscillation frequency of the ring oscillator 1214*b*. Namely, the ring oscillator 1214*b* can be given the high-temperature worst temperature dependency causing the oscillation frequency (the number of oscillations per predetermined period) to decrease as the temperature increases despite under the low-temperature worst condition.

Third Specific Configuration Example of the Ring Oscillator 1214

Figure 23:
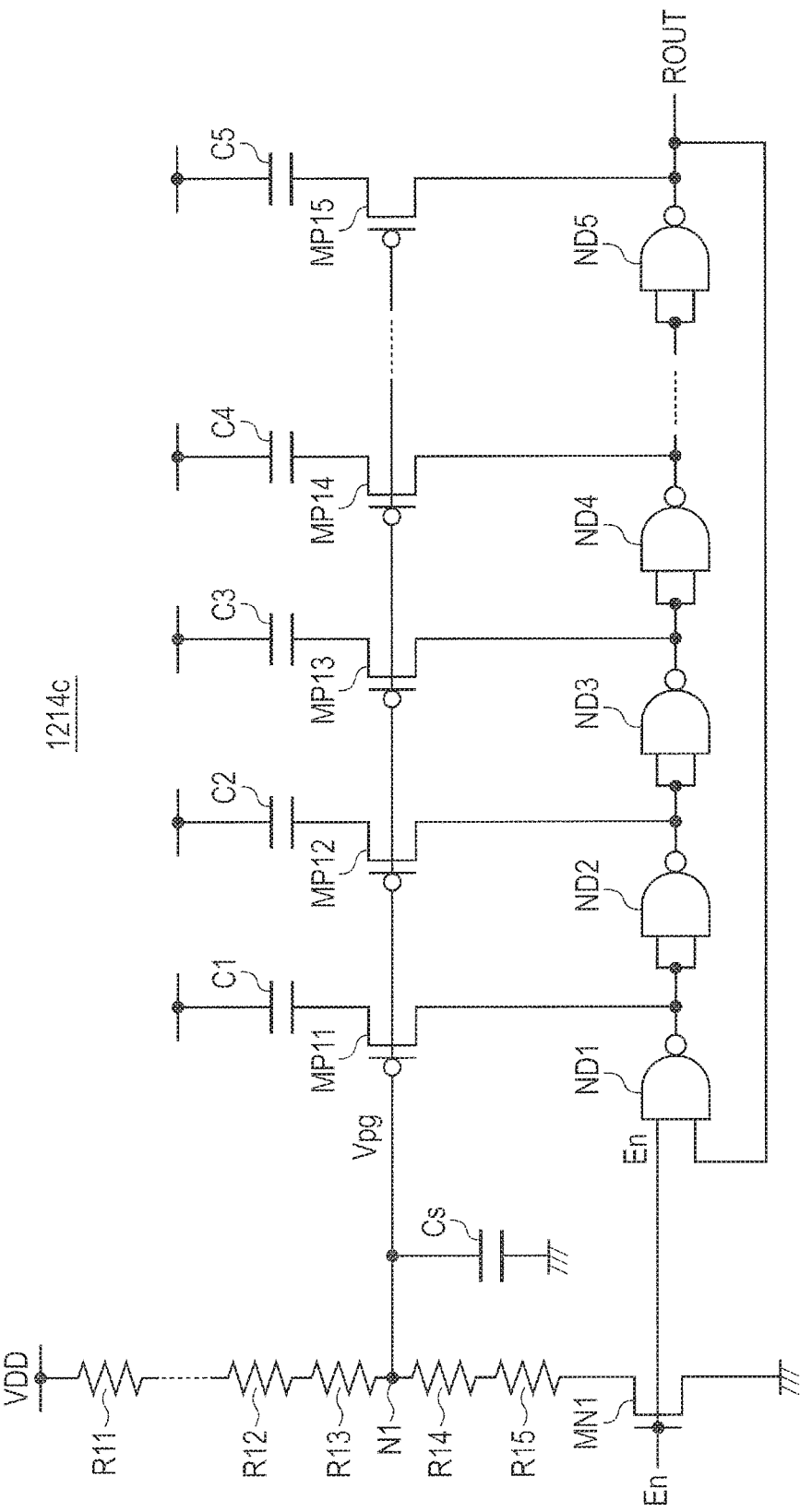
FIG. 23 is a diagram illustrating a specific configuration example of the ring oscillator provided for the oscillator illustrated in FIG. 17.

FIG. 23 is a diagram illustrating a third specific configuration example of the ring oscillator 1214 represented by a ring oscillator 1214*c*.

As illustrated in FIG. 23, the ring oscillator 1214*c* includes NAND circuits ND1 through ND5, PMOS transistors MP11 through MP15, capacitative elements C1 through C5, a capacitative element Cs, resistive elements R11 through R15, and an NMOS transistor MN1. The number of the NAND circuits ND1 through ND5 is not limited to five but can be changed to any number. However, changing the number of the NAND circuits ND1 through ND5 needs to also change the number of transistors MP11 through MP15 and the number of the capacitative elements C1 through C5 accordingly.

The NAND circuits ND1 through ND5 are provided in the form of a ring. The NAND circuit ND1 uses enable signal En from outside to control the presence or absence of oscillation. Specifically, the NAND circuit ND1 outputs negative AND between enable signal En and oscillation signal ROUT. The NAND circuit ND2 receives the output from the NAND circuit ND1 using two input terminals and outputs negative AND. Namely, the NAND circuit ND2 generates an output by logically inverting the output from the NAND circuit ND1. Similarly, the NAND circuit ND3 generates an output by logically inverting the output from the NAND circuit ND2. The NAND circuit ND4 generates an output by logically inverting the output from the NAND circuit ND3. The NAND circuit ND5 generates an output as oscillation signal ROUT by logically inverting the output from the NAND circuit ND4.

The resistive elements R11 through R15 and the transistor MN1 are coupled in series between power-supply voltage terminal VDD and ground voltage terminal VSS. Enable signal En from outside controls an on/off state of the transistor MN1. Capacitative element Cs to stabilize voltage Vpg of node N1 is provided between node N1 (between the resistive elements R13 and R14) and ground voltage terminal VSS. For example, enable signal En, when set to the L level, turns off the transistor MN1. Voltage Vpg therefore increases to the power-supply voltage level (H level). Contrastingly, enable signal En, when set to the H level, turns on the transistor MN1. Voltage Vpg indicates the voltage value corresponding to a resistance ratio of the resistive elements R11 through R15.

The capacitative element C1 is provided between power-supply voltage terminal VDD and the source of the transistor MP11. The drain of the transistor MP11 is coupled to an output terminal of the NAND circuit ND1. Voltage Vpg applied to the gate of the transistor MP11 controls the on-resistance. The capacitative element C2 is provided between power-supply voltage terminal VDD and the source of the transistor MP12. The drain of the transistor MP12 is coupled to an output terminal of the NAND circuit ND2. Voltage Vpg applied to the gate of the transistor MP12 controls the on-resistance. The capacitative element C3 is provided between power-supply voltage terminal VDD and the source of the transistor MP13. The drain of the transistor MP13 is coupled to an output terminal of the NAND circuit ND3. Voltage Vpg applied to the gate of the transistor MP13 controls the on-resistance. The capacitative element C4 is provided between power-supply voltage terminal VDD and the source of the transistor MP14. The drain of the transistor MP14 is coupled to an output terminal of the NAND circuit ND4. Voltage Vpg applied to the gate of the transistor MP14 controls the on-resistance. The capacitative element C5 is provided between power-supply voltage terminal VDD and the source of the transistor MP15. The drain of the transistor MP15 is coupled to an output terminal of the NAND circuit ND5. Voltage Vpg applied to the gate of the transistor MP15 controls the on-resistance.

For example, suppose each transistor has the low-temperature worst temperature dependency. Operation speeds of the NAND circuits ND1 through ND5 increase with an increase in the temperature. Contrastingly, capacitance values of the capacitative elements C1 through C5 viewed from the output terminals of the NAND circuits ND1 through ND5 increase with an increase in the temperature because on-resistances of the transistors MP11 through MP15 decrease with an increase in the temperature. Operation speeds of the NAND circuits ND1 through ND5 increase with an increase in the capacitance values of the capacitative elements C1 through C5 viewed from the output terminals of the NAND circuits ND1 through ND5. It is therefore possible to freely adjust the temperature dependency of the oscillation frequency of the ring oscillator 1214c by adjusting actual capacitance values of the capacitive elements C1 through C5 or the on-resistances of the transistors MP11 through MP15.

For example, suppose each transistor has the high-temperature worst temperature dependency. Operation speeds of the NAND circuits ND1 through ND5 decrease with an increase in the temperature. Contrastingly, capacitance values of the capacitive elements C1 through C5 viewed from the output terminals of the NAND circuits ND1 through ND5 decrease with an increase in the temperature because the on-resistances of the transistors MP11 through MP15 decrease with an increase in the temperature. Operation speeds of the NAND circuits ND1 through ND5 increase with a decrease in the capacitance values of the capacitive elements C1 through C5 viewed from the output terminals of the NAND circuits ND1 through ND5. It is therefore possible to freely adjust the temperature dependency of the oscillation frequency of the ring oscillator 1214c by adjusting actual capacitance values of the capacitive elements C1 through C5 or the on-resistances of the transistors MP11 through MP15.

(Operations of the Semiconductor System SYS1)

The description below explains operations of the semiconductor system SYS1.

Figure 24:
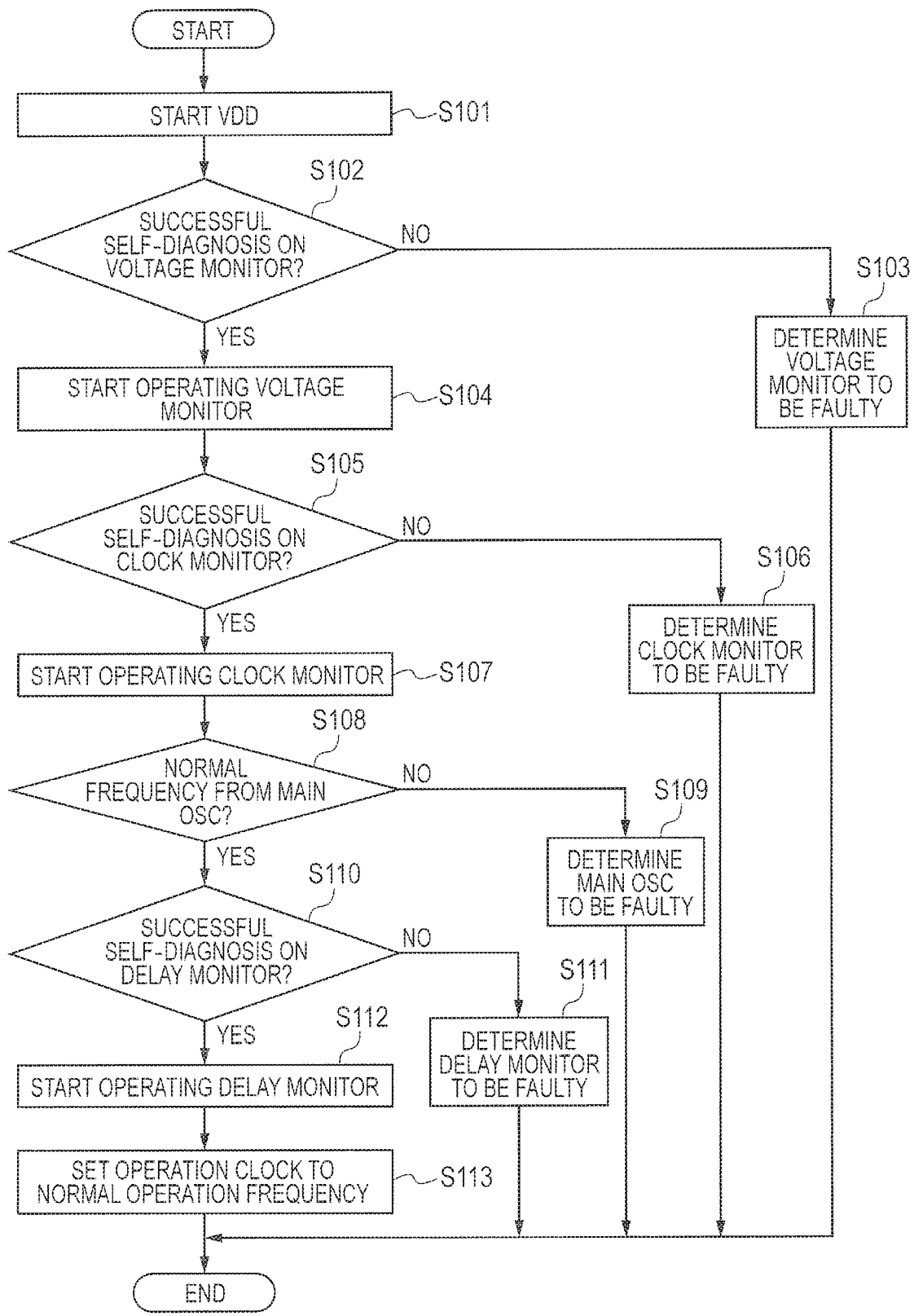
FIG. 24 is a flowchart illustrating a startup operation of the semiconductor system illustrated in FIG. 2.

FIG. 24 is a flowchart illustrating a startup operation of the semiconductor system SYS1.

As illustrated in FIG. 24, the startup operation of the semiconductor system SYS1 first starts power-supply voltage VDD (S101). The CPU in the internal circuit 10 allows the voltage monitor (VMON) 11 to perform self-diagnosis (S102). If a diagnosis result is unacceptable (NO at S102), it is determined that the voltage monitor 11 is faulty (S103). The operation terminates. If a diagnosis result is acceptable (YES at S102), the voltage monitor 11 starts a monitor operation (S104).

The CPU then allows the clock monitor (CLMON) 19 to perform self-diagnosis (S105). If a diagnosis result is unacceptable (NO at S105), it is determined that the clock monitor 19 is faulty (S106). The operation terminates. If a diagnosis result is acceptable (YES at S105), the clock monitor 19 starts a monitor operation (S107).

The clock monitor 19 then diagnoses a frequency of clock signal CLK generated by the main oscillator 17 (S108). If the frequency of clock signal CLK differs from an intended frequency (NO at S108), it is determined that the main oscillator 17 is faulty (S109). The operation terminates. The frequency of clock signal CLK may equal an intended frequency (YES at S108), namely, power-supply voltage VDD and clock signal CLK supplied to the delay monitor (DMON) 12 may be determined to be normal. In this case, the CPU allows the delay monitor (DMON) 12 to perform self-diagnosis (S110).

If a diagnosis result from the delay monitor 12 is unacceptable (NO at S110), it is determined that the delay monitor 12 is faulty (S111). The operation terminates. If a diagnosis result from the delay monitor 12 is acceptable (YES at S110), the delay monitor 12 starts a monitor operation (S112). Namely, all the monitoring circuits start the monitor operation.

The CPU thereby changes the operation clock from a low-speed clock signal generated by built-in oscillator iOCO to a high-speed clock signal generated by multiplying clock signal CLK from the main oscillator 17 (S113). The semiconductor system SYS1 can therefore perform normal operation including the monitor operation performed by each monitoring circuit.

Specific Example of the Self-Diagnostic Method for the Delay Monitor 12

Figure 25:
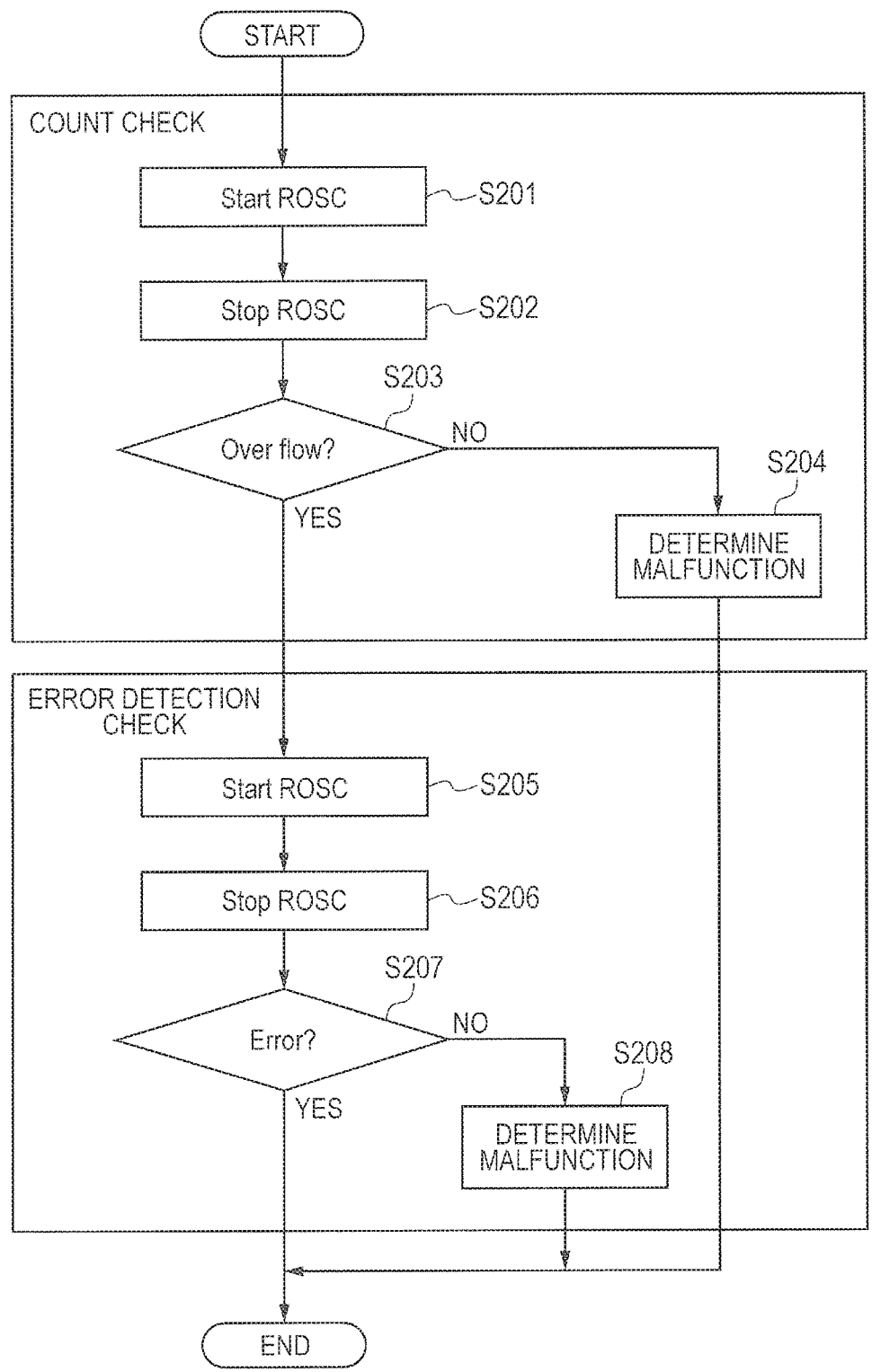
FIG. 25 is a flowchart illustrating a self-diagnostic method for the delay monitor provided for the semiconductor system illustrated in FIG. 2.

FIG. 25 is a flowchart illustrating a specific example of a self-diagnostic method for the delay monitor 12.

As illustrated in FIG. 25, the self-diagnosis for the delay monitor 12 performs two checks, namely, a count check and an error detection check.

The count check performs self-diagnosis on the ring oscillators in the oscillator 121 and the counters in the counter 122. The ring oscillator starts oscillating (S201). The oscillation stops after a lapse of the number of oscillations exceeding an upper limit of count values for the counter (S202). If no overflow occurs in the count by the counter (NO at S203), it is determined that the ring oscillator or the counter is faulty (S204). If an overflow occurs in the count by the counter (YES at S203), it is determined that the ring oscillator and the counter are normal. Control proceeds to the next error detection check.

The error detection check performs self-diagnosis on the comparison circuits in the comparator 123 and the determination circuits in the determiner 124. The ring oscillator starts oscillating (S205). The oscillation stops after a lapse of a predetermined period (S206). The number of oscillations (count value of the counter) per predetermined period is then compared with threshold value TR settled to intentionally cause an error to determine whether an error occurs (S207). If a determination result from the determination circuit shows no error (NO at S207), it is determined that the comparison circuit or the determination circuit is faulty (S208). If a determination result from the determination circuit shows an error (YES at S207), it is determined that the comparison circuit and the determination circuit are normal. The delay monitor 12 completes the self-diagnosis.

(Flow of a Monitoring Operation Performed by Each Monitoring Circuit)

The description below explains a flow of a monitoring operation performed by each monitoring circuit.

Figure 26:
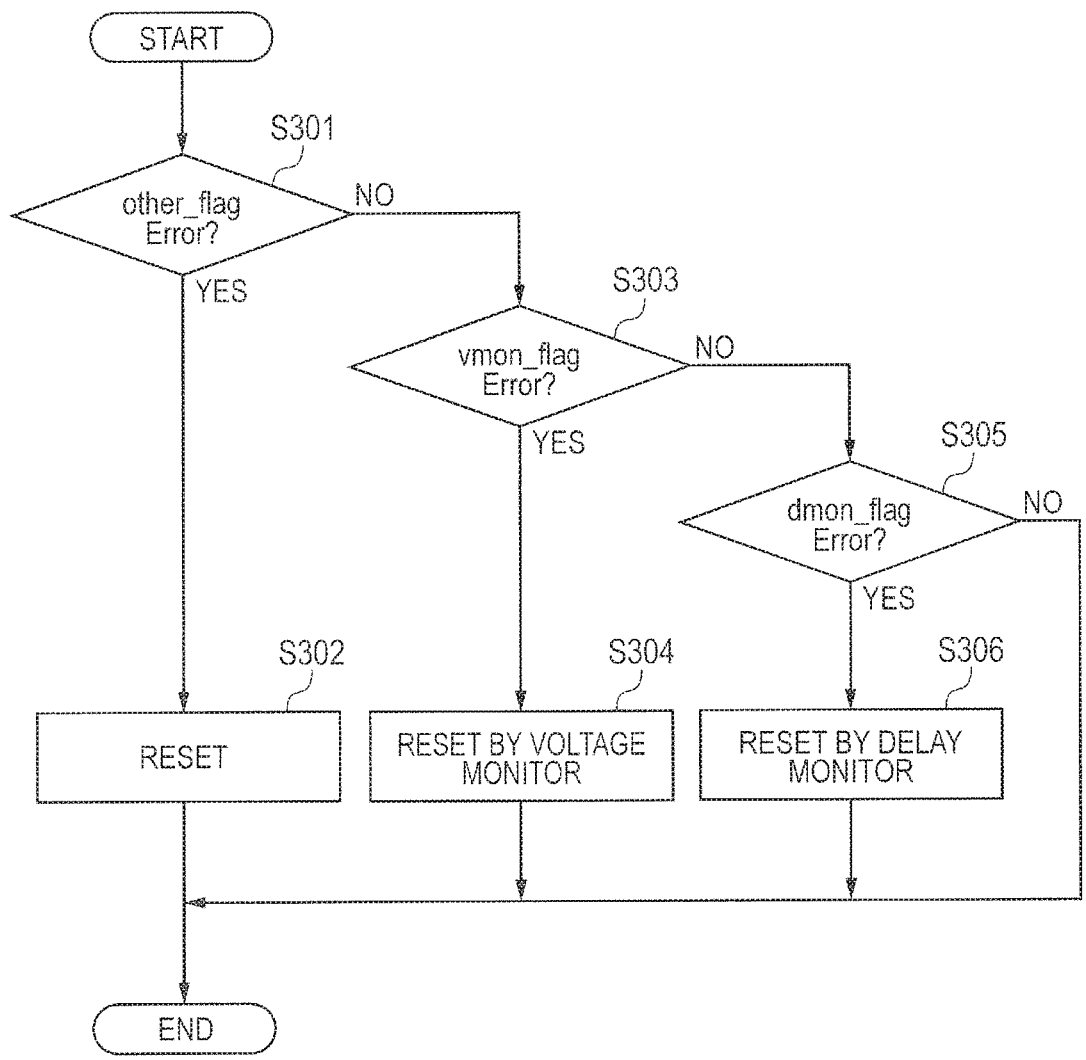
FIG. 26 is a flowchart illustrating a flow of a monitoring operation performed by each monitoring circuit provided for the semiconductor system illustrated in FIG. 2.

FIG. 26 is a flowchart illustrating a flow of a monitoring operation performed by each monitoring circuit.

As illustrated in FIG. 26, suppose a monitoring circuit other than the voltage monitor 11 and the delay monitor 12 detects an error and sets an error flag (YES at S301). In this case, the circuits (such as the internal circuit 10 and the delay monitor 12) in the VDD drive region 1 are reset (S302.). Suppose the error flag is not set (NO at S301) and the voltage monitor 11 detects an error and sets an error flag (YES at S303). In this case, the voltage monitor 11 resets the circuits in the VDD drive region 1 (S304). Suppose the voltage monitor 11 does not set an error flag (NO at S303) and the delay monitor 12 detects an error and sets an error flag (YES at S305). In this case, the delay monitor 12 resets the circuits in the VDD drive region 1 (S306). No error flag is set if the delay monitor 12 does not set an error flag (NO at S305). The semiconductor system SYS1 therefore continues the normal operation.

(Timing Chart)

The description below explains an example of operations of the semiconductor system SYS1 with reference to FIG. 27.

Figure 27:
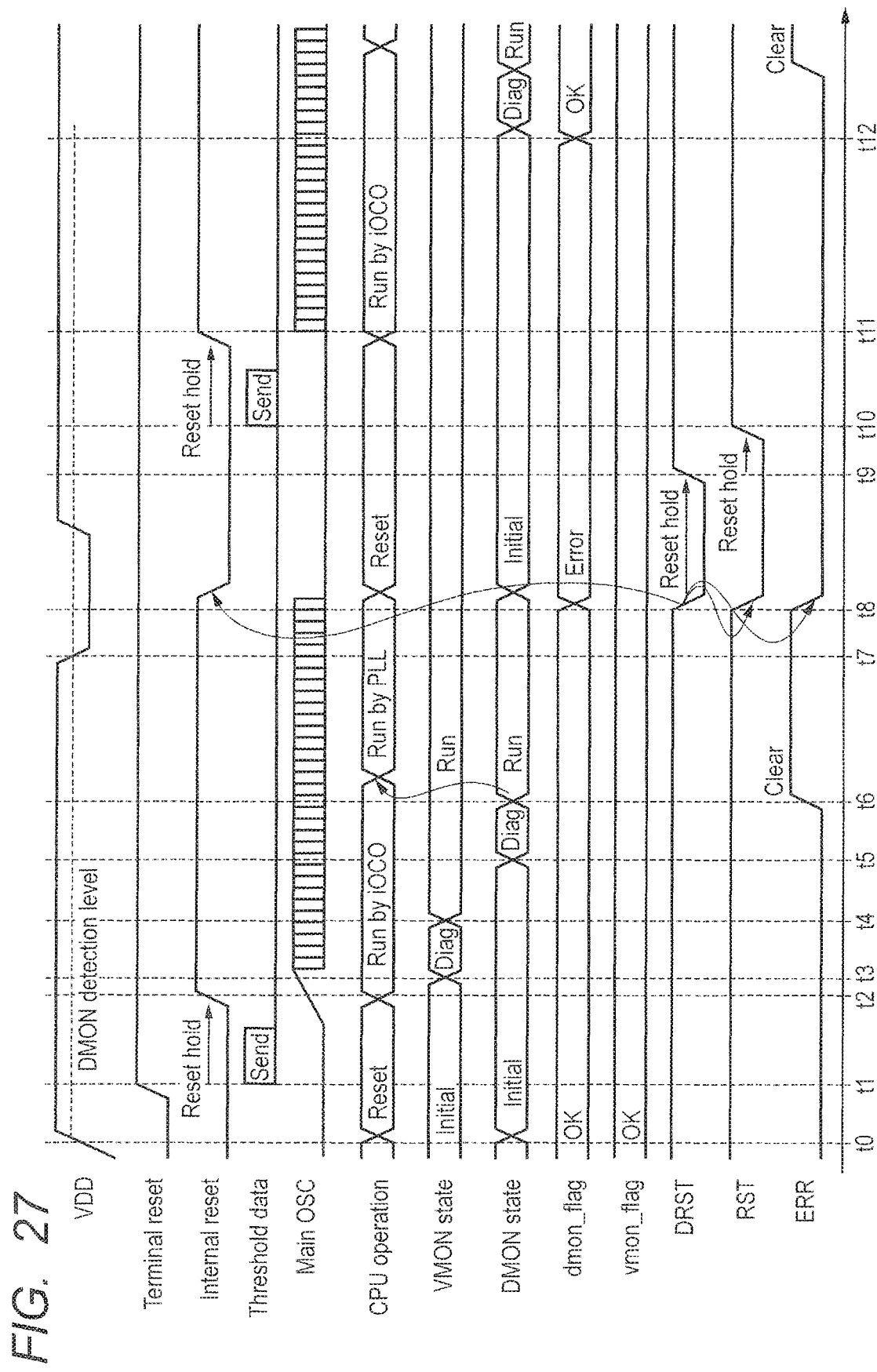
FIG. 27 is a timing chart illustrating operations of the semiconductor system illustrated in FIG. 2.

FIG. 27 is a timing chart illustrating an example of operations of the semiconductor system SYS1.

According to the example in FIG. 27, power-supply voltage VDD is activated (time t0) to release a terminal reset (Terminalreset) for the VDD drive region 1 (time t1) and accordingly release an internal reset (Internalreset) for the VDD drive region 1 (time t2). The CPU provided for the internal circuit 10 thereby starts operating in synchronization with a low-speed clock signal generated by built-in oscillator iOCO (time t2). At this time, the main oscillator (MainOSC) 17 starts oscillating (time t2).

The CPU then performs self-diagnosis on the voltage monitor (VMON) 11 (time t3). After the diagnosis result is confirmed to be normal, the voltage monitor 11 starts the monitor operation (time t4). Thought not illustrated, the clock monitor (CLMON) 19 is also self-diagnosed at this time. The clock monitor 19 after the self-diagnosis is used to diagnose a frequency of clock signal CLK from the main oscillator 17.

The CPU performs self-diagnosis on the delay monitor 12 (time t5) after confirming that power-supply voltage VDD and clock signal CLK supplied to the delay monitor (DMON) 12 are normal. After the diagnosis result is confirmed to be normal, the delay monitor 12 starts the monitor operation (time t6). Namely, all the monitoring circuits starts the monitor operation.

The CPU thereby changes the operation clock from a low-speed clock signal generated by built-in oscillator iOCO to a high-speed clock signal generated by multiplying clock signal CLK from the main oscillator 17. Error signal ERR is also cleared. Namely, the semiconductor system SYS1 starts the normal operation including the monitor operation performed by the monitoring circuits.

A decrease in power-supply voltage VDD allows the signal propagation time for the critical path in the internal circuit 10 to be longer than or equal to an allowable maximum propagation time (time t7). The delay monitor 12 then detects an error and allows reset signal DRST to be active (L level) (time t8). Reset signal RST and error signal ERR therefore also go active (L level) (time t8). The reset signal inside the VDD drive region 1 thereby goes active (L level) to initialize the internal circuit 10 including the CPU and the delay monitor 12. However, the error flag stored in the flag storage register 131 of the delay monitor 12 is retained.

After a lapse of predetermined period, reset signal DRST is released (time t9), reset signal RST is released (time t10), and the internal reset signal is released (time t11). The CPU again starts operating in synchronization with the low-speed clock signal generated by built-in oscillator iOCO (time t11). At this time, the main oscillator 17 also starts oscillating (time t11). The self-diagnosis is again performed on only the delay monitor 12 that stores the error flag. The error flag is then cleared (time t12 or later).

The semiconductor system SYS1 repeats the above-mentioned operation.

(Relation Between the Delay Monitor and the Critical Path)

Figure 28:
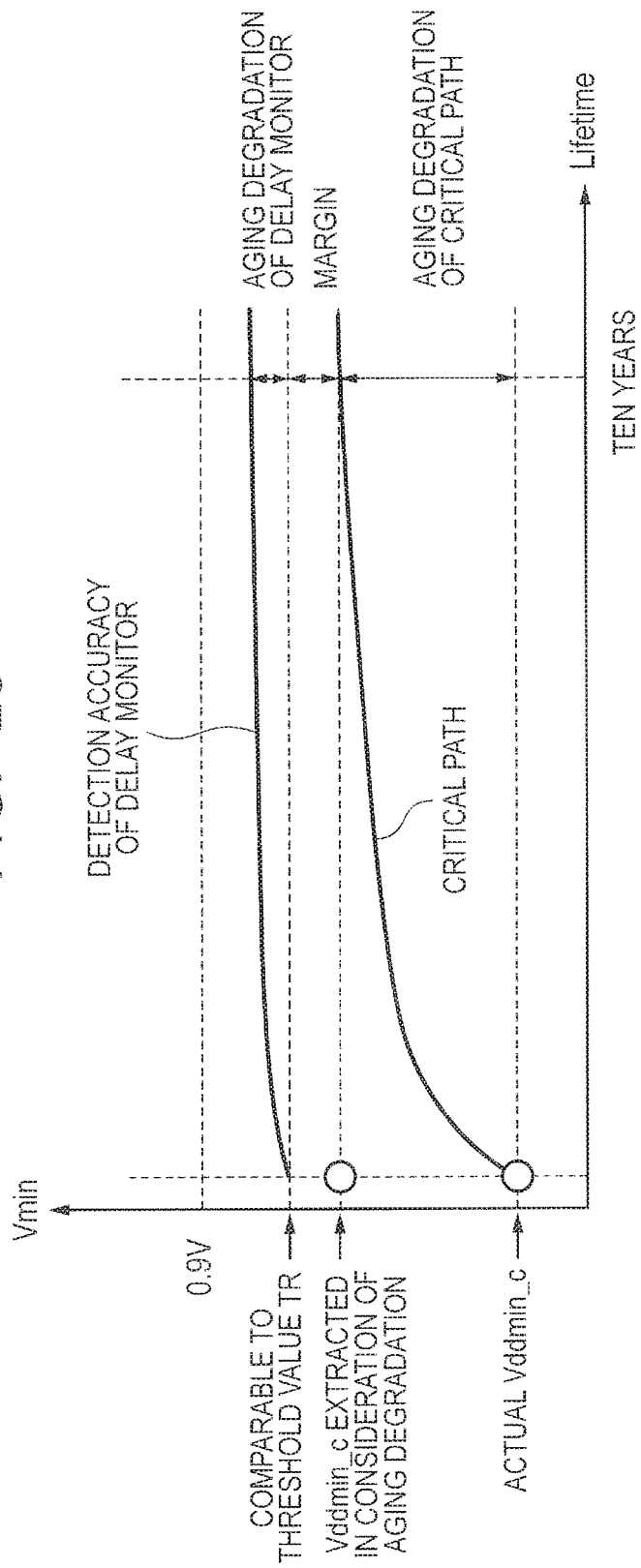
FIG. 28 is a diagram illustrating relation between detection accuracy of the delay monitor and a critical path for a monitoring-targeted circuit.

FIG. 28 is a diagram illustrating relation between the detection accuracy of the delay monitor and the critical path for a monitoring-targeted circuit. With reference to 28, minimum operating voltage Vddmin_c for the internal circuit 10 is extracted in consideration of aging degradation. Adding a margin to minimum operating voltage Vddmin_c results in a voltage comparable to threshold value TR. As above, the delay monitor 12 is configured to minimize an accuracy error due to the aging degradation. When the delay monitor 12 detects an error, therefore, power-supply voltage VDD can be always set to be lower than or equal to a lower limit of power-supply voltage VDD that can be detected by the voltage monitor 11.

Figure 29:
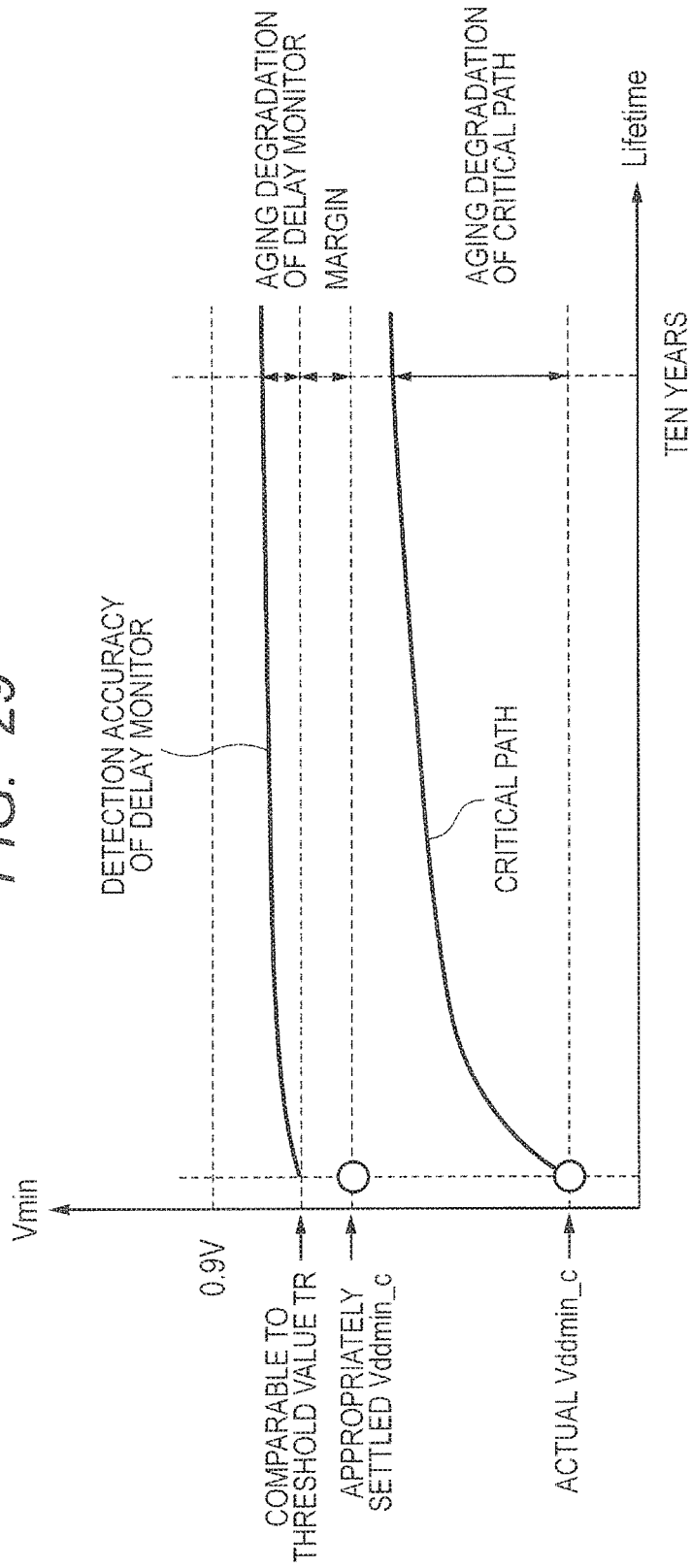
FIG. 29 is a diagram illustrating relation between detection accuracy of the delay monitor and a critical path for a monitoring-targeted circuit.

As illustrated in FIG. 29, however, it may be possible to use minimum operating voltage Vddmin_c appropriately settled based on achievements in the past instead of extracting minimum operating voltage Vddmin_c by trimming.

In the semiconductor system SYS1 according to the first embodiment as above, the voltage monitor 11 monitors whether power-supply voltage VDD decreases to 0.9 V as the minimum operation guarantee voltage for the internal circuit 10. Moreover, the delay monitor 12 monitors whether the signal propagation time for the critical path in the internal circuit 10 falls within an allowable range also in the voltage range of 0.8 V to 0.9 V as the accuracy error range for the voltage monitor 11. Namely, the delay monitor 12 can accurately monitor whether power-supply voltage VDD reaches the actual minimum operating voltage for the internal circuit 10 even when the voltage monitor 11 causes an accuracy error.

The internal circuit 10 can be designed by using a small voltage margin without regard for the accuracy error of the voltage monitor 11. According to the embodiment, the internal circuit 10 can be designed to at least operate when power-supply voltage VDD is higher than or equal to 0.9V. As a result, the alleviated design constraint enables the internal circuit 10 to improve the operating frequency.

The configuration disclosed in patent literature 2 monitors a power-supply voltage by using the ring oscillator to measure the propagation delay time. According to the configuration of patent literature 2, however, a decrease in the power-supply voltage may disable operation of the ring oscillator itself. Namely, the minimum operating voltage of the ring oscillator itself cannot be guaranteed. The aging degradation of the ring oscillator increases an error of the monitor accuracy. In the semiconductor system SYS1 according to the above-mentioned first and second embodiments, the voltage monitor 11 guarantees the minimum operating voltage for the delay monitor 12 including the ring oscillator. The ring oscillator is configured to suppress an accuracy error due to the aging degradation.

While there has been described the specific embodiment of the invention made by the inventors, it is to be distinctly understood that the present invention is not limited to the above-mentioned embodiment and may be embodied in various modifications without departing from the spirit and scope of the invention.

For example, the delay monitor 12 is not limited to the configuration using the ring oscillator but may be appropriately changed to a configuration using a delay line. The description below concisely explains a modification example of the delay monitor 12.

Modification Example of the Delay Monitor 12

Figure 30:
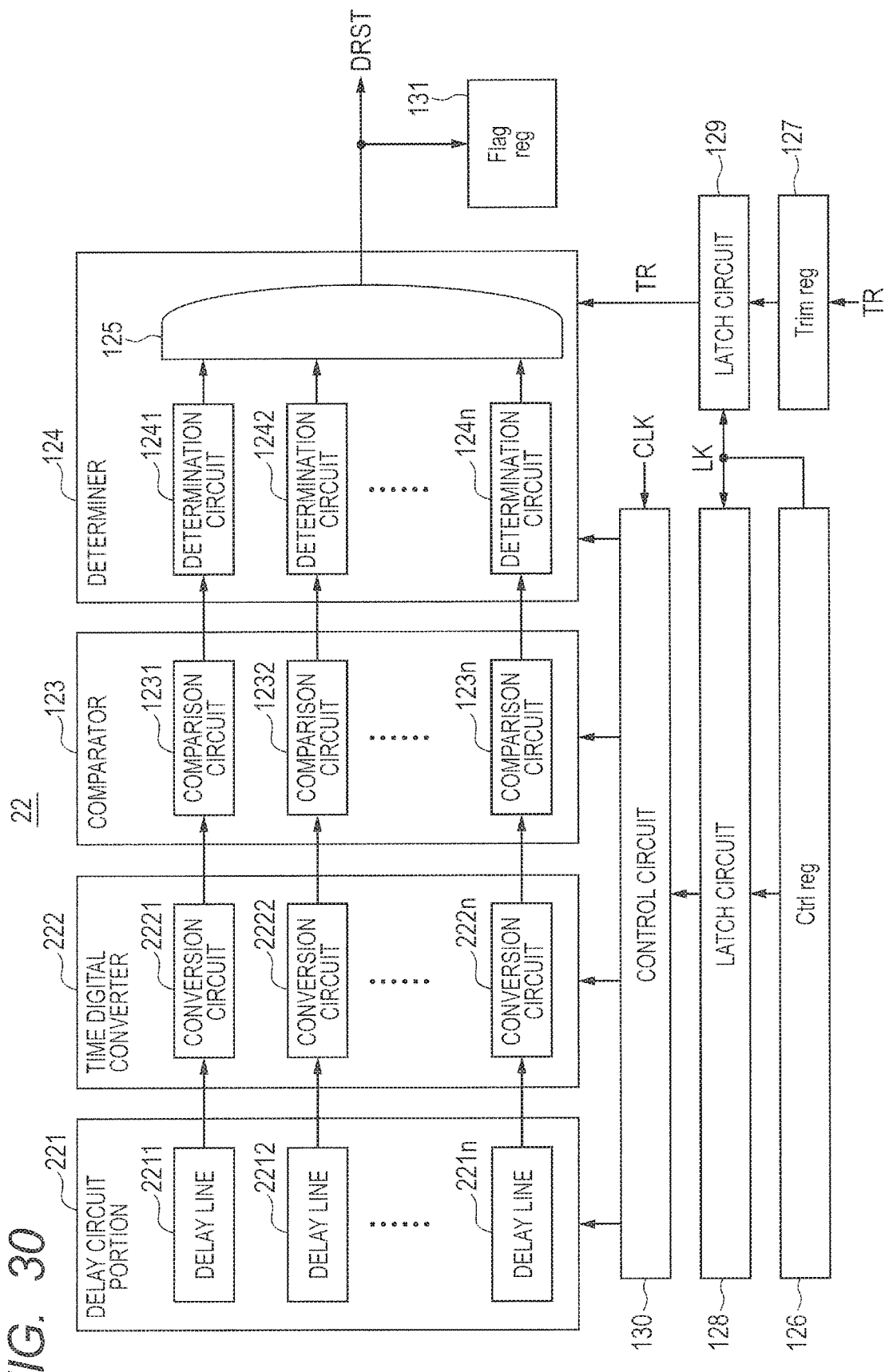
FIG. 30 is a block diagram illustrating a modification example of the delay monitor illustrated in FIG. 4.

FIG. 30 is a diagram illustrating a modification example of the delay monitor 12 as a delay monitor 22.

Compared with the delay monitor 12 illustrated in FIG. 4, the delay monitor 22 illustrated in FIG. 30 includes a delay circuit portion 221 instead of the oscillator 121 and a time digital converter 222 instead of the counter 122.

The delay circuit portion 221 includes n delay lines 2211 through 221n with different characteristics. The delay monitor 22 monitors the time (signal propagation time) between input of signals to the delay lines 2211 through 221n with different characteristics and output thereof and thereby monitors whether the signal propagation time for the critical path in the internal circuit 10 falls within an allowable range.

The time digital converter 222 includes n conversion circuits 2221 through 222n. The conversion circuits 2221 through 222n each convert signal propagation times for the delay lines 2211 through 221n into digital values. The comparator 123 compares the digital value for the time digital converter 222 with a previously predetermined threshold value.

The other configurations of the delay monitor 22 basically equal those of the delay monitor 12 and a description about the configuration is omitted.

For example, the semiconductor device according to the above-mentioned first embodiment may be configured by reversing the conductivity type (p-type or n-type) for semiconductor substrates, semiconductor layers, and diffusion layers (diffusion regions). Suppose one of the conductivity types of p-type and n-type is assumed to be a first conductivity type and the other is assumed to be a second conductivity type. In this case, the first conductivity type can be assumed to be the p-type and the second conductivity type can be assumed to be the n-type. Contrariwise, the first conductivity type can be assumed to be the n-type and the second conductivity type can be assumed to be the p-type.

All or part of the above-mentioned embodiment can be described as the following additional statements but is not limited thereto.

(Additional Statement 1)

A semiconductor system includes:

a monitoring-targeted circuit;

a voltage monitor that is driven by a second power-supply voltage different from a first power-supply voltage supplied to a monitoring-targeted circuit and monitors the first power-supply voltage;

a delay monitor that is driven by the first power-supply voltage and monitors the signal propagation time for a critical path in the monitoring-targeted circuit; and a guard ring that is provided to enclose an outer periphery of the delay monitor in a plan view.

(Additional Statement 2)

In the semiconductor system according to additional statement 1, the guard ring includes a first guard ring formed of a P-type diffusion layer that is formed over a P-well surface and is supplied with a ground voltage.

(Additional Statement 3)

In the semiconductor system according to additional statement 2, the guard ring includes a second guard ring formed of an N-type diffusion layer that is formed over an N-well surface and is supplied with the first power-supply voltage.

(Additional Statement 4)

In the semiconductor system according to additional statement 1, the guard ring includes a first guard ring formed of an N-type diffusion layer that is formed over an N-well surface and is supplied with the first power-supply voltage.

(Additional Statement 5)

The semiconductor system according to additional statement 4, further includes a Deep N-well provided over a layer below the N-well so as to cover a region enclosed by the first guard ring, in which a P-well enclosed by the N-well and the Deep N-well is electrically separated from the other P-wells.

(Additional Statement 6)

A semiconductor system includes:

a monitoring-targeted circuit;

a voltage monitor that is driven by a second power-supply voltage different from a first power-supply voltage supplied to a monitoring-targeted circuit and monitors the first power-supply voltage; and a delay monitor that is driven by the first power-supply voltage and monitors the signal propagation time for a critical path in the monitoring-targeted circuit, in which a buffer region where a dummy cell is placed is formed at a boundary region between a cell placement region for the delay monitor and a cell placement region for the monitoring-targeted circuit in a plan view.

(Additional Statement 7)

In the semiconductor system according to additional statement 6, the buffer region includes a dummy wiring that is provided so as to enclose an outer periphery of the delay monitor in a plan view and is supplied with a fixed potential.

(Additional Statement 8)

In the semiconductor system according to additional statement 6, a signal wiring for the delay monitor is provided for a cell placement region of the delay monitor;

a signal wiring for the monitoring-targeted circuit is provided for a cell placement region of the monitoring-targeted circuit; and the buffer region includes only a signal wiring that exchanges a signal between the delay monitor and the monitoring-targeted circuit.

(Additional Statement 9)

A semiconductor system manufacturing method includes the steps of:

forming a monitoring-targeted circuit;

forming a voltage monitor that is driven by a second power-supply voltage different from a first power-supply voltage supplied to the monitoring-targeted circuit and monitors the first power-supply voltage;

forming a delay monitor that is driven by the first power-supply voltage and monitors the signal propagation time for a critical path in the monitoring-targeted circuit; and forming a guard ring so as to enclose an outer periphery of the delay monitor in a plan view.

(Additional Statement 10)

In the semiconductor system manufacturing method according to additional statement 9, the step of forming the guard ring forms a first guard ring formed of a P-type diffusion layer that is formed over a P-well surface and is supplied with a ground voltage.

(Additional Statement 11)

In the semiconductor system manufacturing method according to additional statement 10, the step of forming the guard ring further forms a second guard ring formed of an N-type diffusion layer that is formed over an N-well surface and is supplied with the first power-supply voltage.

(Additional Statement 12)

In the semiconductor system manufacturing method according to additional statement 9, the step of forming the guard ring forms a first guard ring formed of an N-type diffusion layer that is formed over an N-well surface and is supplied with the first power-supply voltage.

(Additional Statement 13)

The semiconductor system manufacturing method according to additional statement 12, further includes the step of forming a Deep N-well provided over a layer below the N-well so as to cover a region enclosed by the first guard ring electrically separating a P-well enclosed by the N-well and the Deep N-well from the other P-wells.

(Additional Statement 14)

A semiconductor system manufacturing method includes the steps of:

forming a monitoring-targeted circuit;

forming a voltage monitor that is driven by a second power-supply voltage different from a first power-supply voltage supplied to the monitoring-targeted circuit and monitors the first power-supply voltage;

forming a delay monitor that is driven by the first power-supply voltage and monitors the signal propagation time for a critical path in the monitoring-targeted circuit; and forming a buffer region including a dummy cell at a boundary region between a cell placement region for the delay monitor and a cell placement region for the monitoring-targeted circuit in a plan view.

(Additional Statement 15)

In the semiconductor system manufacturing method according to additional statement 14, the buffer region includes a dummy wiring that is provided so as to enclose an outer periphery of the delay monitor in a plan view and is supplied with a fixed potential.

(Additional Statement 16)

The semiconductor system manufacturing method according to additional statement 14, includes:

providing a cell placement region of the delay monitor with a signal wiring of the delay monitor;

providing a cell placement region of the monitoring-targeted circuit with a signal wiring of the monitoring-targeted circuit; and providing the buffer region with only a signal wiring that exchanges a signal between the delay monitor and the monitoring-targeted circuit.

(Additional Statement 17)

A semiconductor device includes:

a voltage monitor that is driven by a second power-supply voltage different from a first power-supply voltage supplied to a monitoring-targeted circuit and monitors the first power-supply voltage; and a delay monitor that is driven by the first power-supply voltage and monitors the signal propagation time for a critical path in the monitoring-targeted circuit, in which the delay monitor is configured so that a largest on-resistance of on-resistances for a plurality of transistors configuring the delay monitor is smaller than a largest on-resistance of on-resistances for a plurality of transistors configuring the monitoring-targeted circuit.

(Additional Statement 18)

In the semiconductor device according to additional statement 17, the delay monitor includes a delay information generator driven by the first power-supply voltage, and monitors the signal propagation time for a critical path in the monitoring-targeted circuit by monitoring delay information generated by the delay information generator.

(Additional Statement 19)

In the semiconductor device according to additional statement 18, the delay information generator includes a first ring oscillator driven by the first power-supply voltage; and the delay monitor further includes:

a first counter that counts the number of oscillations per predetermined period for an oscillation signal output from the first ring oscillator;

a first comparison circuit that compares a count value of the first counter with a first threshold value; and a first determination circuit that determines whether the signal propagation time for a critical path in the monitoring-targeted circuit falls within an allowable range, based on a comparison result from the first comparison circuit.

(Additional Statement 20)

In the semiconductor device according to additional statement 19, the first determination circuit determines that the signal propagation time for a critical path in the monitoring-targeted circuit falls within an allowable range when a count value of the first counter is greater than the first threshold value, and determines that the signal propagation time for a critical path in the monitoring-targeted circuit does not fall within an allowable range when a count value of the first counter is smaller than or equal to the first threshold value.

(Additional Statement 21)

In the semiconductor device according to additional statement 20, the first determination circuit determines that the signal propagation time for a critical path in the monitoring-targeted circuit does not fall within an allowable range when the number of occurrences to make the count value of the first counter smaller than or equal to the first threshold value reaches a predetermined count.

(Additional Statement 22)

In the semiconductor device according to additional statement 19, the first ring oscillator includes a plurality of NOR circuits and a plurality of NAND circuits alternately provided in the form of a ring; and a driving capability of each of the NOR circuits is greater than a driving capability of each of the NAND circuits.

(Additional Statement 23)

In the semiconductor device according to additional statement 22, the first ring oscillator further includes:

a diode provided between a voltage terminal corresponding to a higher potential generated from the NOR circuits or the NAND circuits and a power-supply voltage terminal supplied with the first power-supply voltage; and a level shifter that shifts a voltage range for an output signal from any of the circuits to a range for the first power-supply voltage and the ground voltage.

(Additional Statement 24)

In the semiconductor device according to additional statement 22, the first ring oscillator further includes a resistive element provided for a ring formed by the NOR circuits and the NAND circuits.

(Additional Statement 25)

In the semiconductor device according to additional statement 19, the delay information generator further includes a second ring oscillator that is driven by the first power-supply voltage and differs from the first ring oscillator in temperature dependency; and the delay monitor further includes:

a second counter that counts the number of oscillations per predetermined period for an oscillation signal output from the second ring oscillator;

a second comparison circuit that compares a count value of the second counter with a second threshold value; and a second determination circuit that determines whether the signal propagation time for a critical path in the monitoring-targeted circuit falls within an allowable range, based on a comparison result from the second comparison circuit.

(Additional Statement 26)

In the semiconductor device according to additional statement 25, the second ring oscillator has temperature dependency opposite to that of the first ring oscillator.

(Additional Statement 27)

In the semiconductor device according to additional statement 18, the delay information generator includes a first signal propagation path that is driven by the first power-supply voltage and outputs an output signal corresponding to an input signal; and the delay monitor further includes:

a first conversion circuit that converts into a digital signal the time between input of an input signal to the first signal propagation path and output of an output signal;

a first comparison circuit that compares a conversion result from the first conversion circuit with a first threshold value; and a first determination circuit that determines whether the signal propagation time for a critical path in the monitoring-targeted circuit falls within an allowable range, based on a comparison result from the first comparison circuit.

(Additional Statement 28)

In the semiconductor device according to additional statement 17, the delay monitor is configured to operate even when the voltage monitor determines that the first power-supply voltage reaches a minimum operation guarantee voltage for the monitoring-targeted circuit.

(Additional Statement 29)

A semiconductor system includes:

the semiconductor device according to additional statement 17; and a monitoring-targeted circuit monitored by the semiconductor device.

What is claimed is:

1. A semiconductor device comprising:
a voltage monitor that is driven by a second power-supply voltage different from a first power-supply voltage supplied to a monitoring-targeted circuit and monitors the first power-supply voltage; and
a delay monitor that is driven by the first power-supply voltage and monitors signal propagation time for a critical path in the monitoring-targeted circuit,
wherein the delay monitor is configured so that a largest on-resistance of on-resistances for a plurality of transistors configuring the delay monitor is smaller than a largest on-resistance of on-resistances for a plurality of transistors configuring the monitoring-targeted circuit,
wherein the delay monitor is configured so that a largest threshold voltage of threshold voltages for the transistors configuring the delay monitor is smaller than a largest threshold voltage of threshold voltages for the transistors configuring the monitoring-targeted circuit.

2. The semiconductor device according to claim 1, wherein the delay monitor is configured so that a longest gate length of gate lengths of gate electrodes of the transistors configuring the delay monitor is shorter than a longest gate length of gate lengths of gate electrodes of the transistors configuring the monitoring-targeted circuit.

3. A semiconductor system comprising:
the semiconductor device according to claim 1; and
a monitoring-targeted circuit monitored by the semiconductor device.

4. The semiconductor system according to claim 3 further comprising:
a guard ring that is provided to enclose an outer periphery of the delay monitor in a plan view.

5. The semiconductor system according to claim 4, wherein the guard ring includes a first guard ring formed of a P-type diffusion layer that is formed over a P-well surface and is supplied with a ground voltage.

6. The semiconductor system according to claim 5, wherein the guard ring includes a second guard ring formed of an N-type diffusion layer that is formed over an N-well surface and is supplied with the first power-supply voltage.

7. The semiconductor system according to claim 4, wherein the guard ring includes a first guard ring formed of an N-type diffusion layer that is formed over an N-well surface and is supplied with the first power-supply voltage.

8. The semiconductor system according to claim 7 further comprising:
a Deep N-well provided over a layer below the N-well so as to cover a region enclosed by the first guard ring,
wherein a P-well enclosed by the N-well and the Deep N-well is electrically separated from other P-wells.

9. The semiconductor system according to claim 3, wherein a buffer region where a dummy cell is placed is formed at a boundary region between a cell placement region for the delay monitor and a cell placement region for the monitoring-targeted circuit in a plan view.

10. The semiconductor system according to claim 9, wherein the buffer region includes a dummy wiring that is provided so as to enclose an outer periphery of the delay monitor in a plan view and is supplied with a fixed potential.

11. The semiconductor system according to claim 9,
wherein a signal wiring for the delay monitor is provided for a cell placement region of the delay monitor;
wherein a signal wiring for the monitoring-targeted circuit is provided for a cell placement region of the monitoring-targeted circuit; and
wherein the buffer region includes only a signal wiring that exchanges a signal between the delay monitor and the monitoring-targeted circuit.

12. A semiconductor device comprising:
a voltage monitor that is driven by a second power-supply voltage different from a first power-supply voltage supplied to a monitoring-targeted circuit and monitors the first power-supply voltage; and
a delay monitor that is driven by the first power-supply voltage and monitors signal propagation time for a critical path in the monitoring-targeted circuit,
wherein the delay monitor is configured so that a largest on-resistance of on-resistances for a plurality of transistors configuring the delay monitor is smaller than a largest on-resistance of on-resistances for a plurality of transistors configuring the monitoring-targeted circuit,
wherein the delay monitor is configured so that a narrowest gate width of gate widths of gate electrodes of the transistors configuring the delay monitor is wider than a narrowest gate width of gate widths of gate electrodes of the transistors configuring the monitoring-targeted circuit.

13. The semiconductor device according to claim 12, wherein the delay monitor is configured so that a thickest gate oxide film of gate oxide films of the transistors configuring the delay monitor is thinner than a thickest gate oxide film of gate oxide films of the transistors configuring the monitoring-targeted circuit.

14. A semiconductor device manufacturing method comprising the steps of:

forming a voltage monitor that is driven by a second power-supply voltage different from a first power-supply voltage supplied to a monitoring-targeted circuit and monitors the first power-supply voltage; and forming a delay monitor that is driven by the first power-supply voltage and monitors signal propagation time for a critical path in the monitoring-targeted circuit, wherein the step of forming the delay monitor allows a largest on-resistance of on-resistances for a plurality of transistors configuring the delay monitor to be smaller than a largest on-resistance of on-resistances for a plurality of transistors configuring the monitoring-targeted circuit, wherein the step of forming the delay monitor allows a largest threshold voltage of threshold voltages for the transistors configuring the delay monitor to be smaller than a largest threshold voltage of threshold voltages for the transistors configuring the monitoring-targeted circuit.

15. The semiconductor device manufacturing method according to claim 14, wherein the step of forming the delay monitor allows a longest gate length of gate lengths of gate electrodes of the transistors configuring the delay monitor to be shorter than a longest gate length of gate lengths of gate electrodes of the transistors configuring the monitoring-targeted circuit.

16. The semiconductor device manufacturing method according to claim 14, wherein the step of forming the delay monitor allows a narrowest gate width of gate widths of gate electrodes of the transistors configuring the delay monitor to be wider than a narrowest gate width of gate widths of gate electrodes of the transistors configuring the monitoring-targeted circuit.

17. The semiconductor device manufacturing method according to claim 14, wherein the step of forming the delay monitor allows a thickest gate oxide film of gate oxide films of the transistors configuring the delay monitor to be thinner than a thickest gate oxide film of gate oxide films of the transistors configuring the monitoring-targeted circuit.

18. The semiconductor device manufacturing method according to claim 14, wherein the step of forming the delay monitor allows a timing tolerance for each path of the delay monitor to be larger than a timing tolerance for each path of the monitoring-targeted circuit.

* * * * *